(12) United States Patent
Hopkins et al.

(10) Patent No.: US 11,963,359 B2
(45) Date of Patent: Apr. 16, 2024

(54) INTEGRATED ASSEMBLIES, AND METHODS OF FORMING INTEGRATED ASSEMBLIES

(71) Applicant: Micron Technology, Inc., Boise, ID (US)

(72) Inventors: John D. Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/199,630

(22) Filed: May 19, 2023

(65) Prior Publication Data

US 2023/0292512 A1 Sep. 14, 2023

Related U.S. Application Data

(62) Division of application No. 17/126,777, filed on Dec. 18, 2020, now Pat. No. 11,716,848.

(51) Int. Cl.
| | |
|---|---|
| *H10B 43/27* | (2023.01) |
| *H10B 41/27* | (2023.01) |
| *H10B 41/41* | (2023.01) |
| *H10B 41/50* | (2023.01) |
| *H10B 43/40* | (2023.01) |
| *H10B 43/50* | (2023.01) |

(52) U.S. Cl.
CPC ............. *H10B 43/27* (2023.02); *H10B 41/27* (2023.02); *H10B 41/41* (2023.02); *H10B 41/50* (2023.02); *H10B 43/40* (2023.02); *H10B 43/50* (2023.02)

(58) Field of Classification Search
CPC .. H10B 43/50; H10B 41/50; H10B 20/40–65; H10B 53/20; H10B 41/20–27; H10B 43/20–27; H10B 51/20; H10B 63/84–845; H01L 27/11548; H01L 27/11595; H01L 27/11512; H01L 27/11273; H01L 27/1128; H01L 27/11514; H01L 27/11551; H01L 27/11553; H01L 27/11556; H01L 27/11578; H01L 27/1158; H01L 27/11582; H01L 27/11597; H01L 27/2481; H01L 27/249
See application file for complete search history.

(56) References Cited

U.S. PATENT DOCUMENTS 11,476,332 B2 10/2022 Greenlee et al.

*Primary Examiner* — Amar Movva
(74) *Attorney, Agent, or Firm* — Well St. John P.S.

(57) ABSTRACT

Some embodiments include an integrated assembly having a first memory region, a second memory region, and an intermediate region between the first and second memory regions. The intermediate region has a first edge proximate the first memory region and has a second edge proximate the second memory region. Channel-material-pillars are arranged within the first and second memory regions. Conductive posts are arranged within the intermediate region. Doped-semiconductor-material is within the intermediate region and is configured as a substantially H-shaped structure having a first leg region along the first edge, a second leg region along the second edge, and a belt region adjacent the panel. Some embodiments include methods of forming integrated assemblies.

6 Claims, 26 Drawing Sheets

INTEGRATED ASSEMBLIES, AND METHODS OF FORMING INTEGRATED ASSEMBLIES

RELATED PATENT DATA

This patent is a divisional of and claims priority to U.S. patent application Ser. No. 17/126,777, filed Dec. 18, 2020, the disclosures of which are incorporated herein by reference.

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_i$, tile column$_j$ and tile column$_k$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select-device (e.g., source-side select gate, SGS) 210 and a drain-select device (e.g., drain-side select gate, SGD) 212. Each source-select-device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select-device 210 is connected to a common source line 216. The drain of each source-select-device 210 is connected to the source of the first charge-storage transistor 208 of the corresponding NAND string 206. For example, the drain of source-select-device $210_1$ is connected to the source of charge-storage transistor $208_1$ of the corresponding NAND string $206_1$. The source-select-devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

The vertically-stacked memory cells of three-dimensional NAND architecture may be block-erased by generating hole carriers beneath them, and then utilizing an electric field to sweep the hole carriers upwardly along the memory cells.

Gating structures of transistors may be utilized to provide gate-induced drain leakage (GIDL) which generates the holes utilized for block-erase of the memory cells. The transistors may be the source-side select (SGS) devices described above. The channel material associated with a string of memory cells may be configured as a channel material pillar, and a region of such pillar may be gatedly coupled with an SGS device. The gatedly coupled portion of the channel material pillar is a portion that overlaps a gate of the SGS device.

It can be desired that at least some of the gatedly coupled portion of the channel material pillar be heavily doped. In some applications it can be desired that the gatedly coupled portion include both a heavily-doped lower region and a lightly-doped upper region; with both regions overlapping the gate of the SGS device. Specifically, overlap with the lightly-doped region provides a non-leaky "OFF" characteristic for the SGS device, and overlap with the heavily-doped region provides leaky GIDL characteristics for the SGS device. The terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some applications, the term "lightly-doped" refers to semiconductor material having less than or equal to about $10^{18}$ atoms/cm$^3$ of dopant, and the term "heavily-doped" refers to semiconductor material having greater than or equal to about $10^{22}$ atoms/cm$^3$ of dopant.

The channel material may be initially doped to the lightly-doped level, and then the heavily-doped region may be formed by out-diffusion from an underlying doped-semiconductor-material.

It is desired to develop improved methods of forming integrated memory (e.g., NAND memory). It is also desired to develop improved memory devices.

BRIEF DESCRIPTION OF THE DRAWINGS

FIG. 10A-1 is a diagrammatic cross-sectional side view of the region of FIG. 10A shown at an alternative example process stage relative to that of FIG. 10A.

FIG. 11A-1 is a diagrammatic cross-sectional side view of the region of FIG. 11A shown at an alternative example process stage relative to that of FIG. 11A.

FIG. 12A-1 is a diagrammatic cross-sectional side view of the region of FIG. 12A shown at an alternative example process stage relative to that of FIG. 12A.

FIG. 12C-1 is a diagrammatic top-down view of the region of FIG. 12C shown at an alternative example process stage relative to that of FIG. 12C.

DETAILED DESCRIPTION OF THE ILLUSTRATED EMBODIMENTS

Some embodiments include utilization of doped-semiconductor-material to protect regions of an integrated assembly during formation of conduits and/or other openings. Some embodiments include integrated assemblies having doped-semiconductor-material adjacent to some regions of a panel and not adjacent to other regions of the panel, with the panel separating one memory-block-region from another. Example embodiments are described with reference to FIGS. 5-12.

Figure 5:
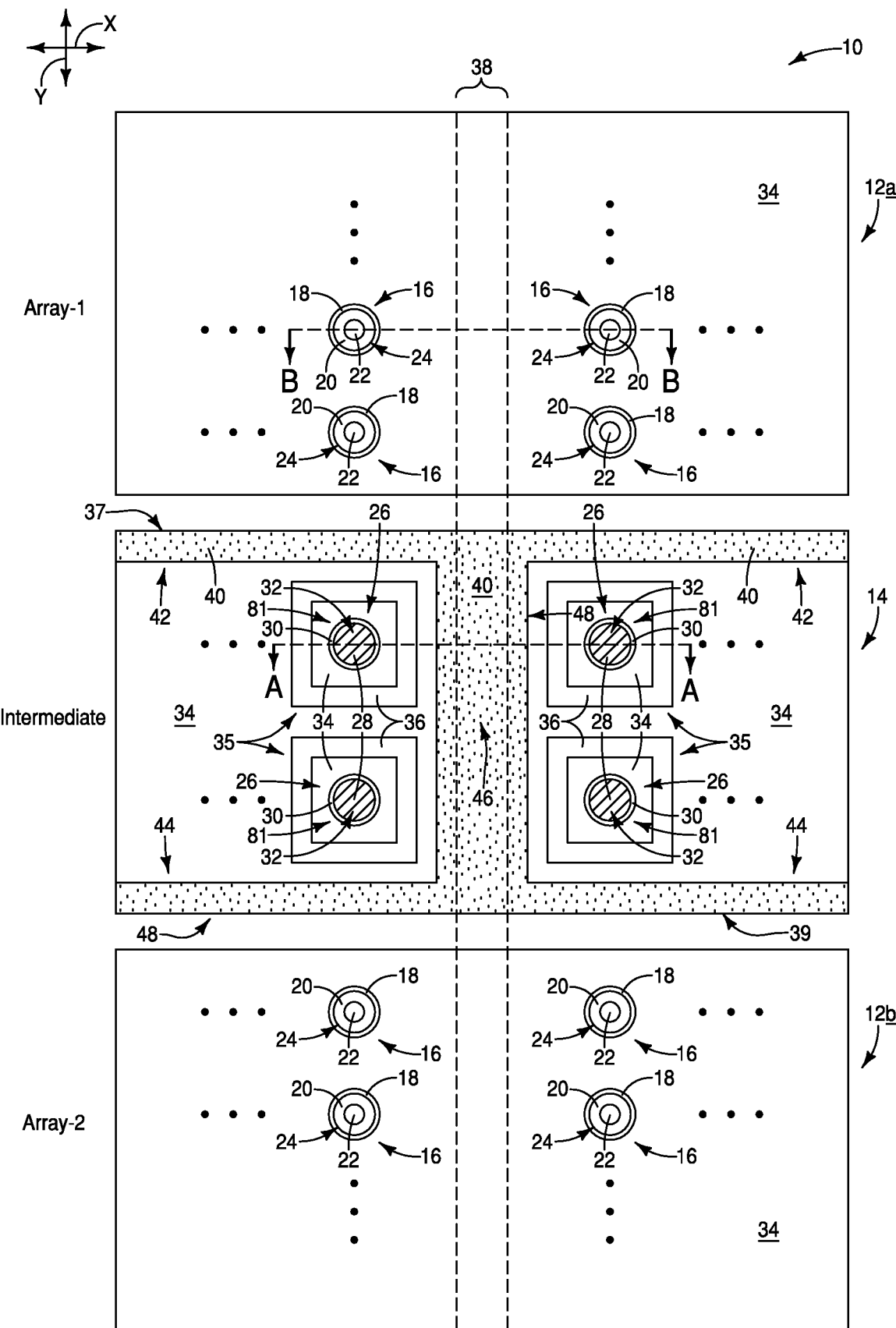
FIGS. 5-5B are a diagrammatic top-down view (FIG. 5) and a pair of diagrammatic cross-sectional side views (FIGS. 5A and 5B) of regions of an example integrated assembly at an example process stage of an example embodiment method for forming an example memory device. The cross-sectional side views of FIGS. 5A and 5B are along the lines A-A and B-B of FIG. 5, respectively. The top-down view of FIG. 5 is along the lines C-C of FIGS. 5A and 5B.

FIG. 5 shows a top-down view along several example regions of an example integrated assembly 10. The illustrated regions of the assembly 10 include a pair of memory regions (memory array regions) 12a and 12b (Array-1 and Array-2), and include an intermediate region 14 between the memory regions. In some embodiments, the memory regions 12a and 12b may be referred to as first regions which are laterally displaced relative to one another (laterally offset from one another), and the intermediate region 14 may be referred to as another region (or as a second region) which is between the laterally-displaced (laterally-offset) first regions.

Cell-material-pillars 16 are arranged within the memory regions 12a and 12b. The pillars 16 may be substantially identical to one another, with the term "substantially identical" meaning identical to within reasonable tolerances of fabrication and measurement. The pillars 16 may be configured in a tightly-packed arrangement within each of the memory regions 12a and 12b, such as, for example, a hexagonal close packed (HCP) arrangement. There may be hundreds, thousands, millions, hundreds of thousands, etc., of the pillars 16 arranged within each of the memory regions 12a and 12b.

Each of the pillars 16 comprises an outer region 18 containing memory cell materials, a channel material 20 adjacent the outer region 18, and an insulative material 22 surrounded by the channel material 20.

The cell materials within the region 18 may comprise tunneling material, charge-storage material and charge-blocking material. The tunneling material (also referred to as gate dielectric material) may comprise any suitable composition(s); and in some embodiments may comprise one or more of silicon dioxide, aluminum oxide, hafnium oxide, zirconium oxide, etc. The charge-storage material may comprise any suitable composition(s); and in some embodiments may comprise floating gate material (e.g., polysilicon) or charge-trapping material (e.g., one or more of silicon nitride, silicon oxynitride, conductive nanodots, etc.). The charge-blocking material may comprise any suitable composition(s); and in some embodiments may comprise one or more of silicon dioxide, aluminum oxide, hafnium oxide, zirconium oxide, etc.

The channel material 20 comprises semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise, consist essentially of, or consist of appropriately-doped silicon.

The channel material 20 may be considered to be configured as channel-material-pillars 24. In the illustrated embodiment, the channel-material-pillars 24 are configured as annular rings in the top-down view of FIG. 5, with such annular rings surrounding the insulative material 22. Such configuration of the channel-material-pillars may be considered to correspond to a "hollow" channel configuration, with the insulative material 22 being provided within the hollows of the channel-material-pillars. In other embodiments, the channel material 22 may be configured as solid pillars. In some embodiments, the channel-material-pillars within the memory region 12a may be referred to as first channel-material-pillars, and the channel-material-pillars within the memory region 12b may be referred to as second channel-material pillars. The channel-material-pillars may be arranged within the first and second memory regions 12a and 12b in any suitable configurations. In some embodiments they may be arranged in tightly-packed configurations, such as, for example, hexagonal-close-packed (HCP) configurations.

The insulative material 22 may comprise any suitable composition(s), and in some embodiments may comprise, consist essentially of, or consist of silicon dioxide.

Posts 26 are arranged within the intermediate region 14. Each of the illustrated posts 26 includes a conductive material 28 laterally surrounded by an insulative liner 30. The posts 26 may be arranged in any suitable configuration, and may or may not be the same size and composition as one another.

The conductive material 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 28 may comprise one or more of tungsten, titanium nitride and tungsten nitride. For instance, the conductive material 28 may comprise a conductive liner comprising one or both of titanium nitride and tungsten nitride along the insulative liner 30, and may comprise a tungsten fill laterally surrounded by the conductive liner.

The insulative liner 30 may comprise any suitable composition(s), and in some embodiments may comprise, consist essentially of, or consist of silicon dioxide.

The posts 26 are shown to be laterally surrounded by first and second materials 34 and 36, with the material 36 being configured as annular rings 35 surrounding the material 34.

The first material 34 may comprise undoped semiconductor material, such as, for example, undoped silicon. The term "undoped" doesn't necessarily mean that there is absolutely no dopant present within the semiconductor material, but rather means that any dopant within such semiconductor material is present to an amount generally understood to be insignificant. For instance, undoped silicon may be understood to comprise a dopant concentration of less than about $10^{16}$ atoms/cm$^3$, less than about $10^{15}$ atoms/cm$^3$, etc., depending on the context. In some embodiments, the material 34 may comprise, consist essentially of, or consist of silicon.

In the illustrated embodiment, the undoped semiconductor material 34 extends around the pillars 16 within the memory regions 12a and 12b, and extends outwardly of the insulative material 30 within the intermediate region 14. In some embodiments, the material 34 is a sacrificial material within the memory regions 12a and 12b (as discussed in more detail relative to processing described below with reference to FIG. 7B), and accordingly the material 34 may comprise any suitable sacrificial material including, but not limited to, undoped semiconductor material (e.g., undoped silicon).

The second material 36 may comprise any suitable composition(s), and may, for example, comprise, consist essentially of, or consist of silicon dioxide.

In some embodiments, the conductive material 28 of the posts 26 may be referred to as conductive posts 32. Such conductive posts may be "live", and accordingly may be utilized as electrical interconnects. Alternatively, the posts may be "dummy", and may be utilized simply for providing structural support.

There may be hundreds, thousands, millions, etc., of the conductive posts 26 provided within the intermediate region 14.

The intermediate region 14 may comprise numerous regions associated with integrated memory, including, for example, staircase regions, crest regions, bridging regions, etc. If the conductive posts 32 are live posts, such may be utilized for interconnecting components associated with the memory regions 12a and 12b to circuitry beneath the illustrated region of the integrated assembly 10. For instance, the conductive posts may be utilized for connecting bitlines to sensing circuitry (e.g., sense-amplifier-circuitry), for connecting SGD devices to control circuitry, etc.

The top-down view of FIG. 5 diagrammatically shows the intermediate region 14 to have a first boundary edge 37 proximate the first memory region 12a, and to have a second boundary edge 39 proximate the second memory region 12b. The boundary edges 37 and 39 may be considered to be along first and second sides of the intermediate region 14, respectively; with such first and second sides being in opposing relation relative to one another.

The boundary edges 37 and 39 may be considered to extend along a first direction (an illustrated x-axis direction).

A slit-opening-location 38 is diagrammatically illustrated in FIG. 5 with dashed lines. The slit-opening-location 38 extends along a second direction (an illustrated y-axis direction) which crosses the first direction (the illustrated x-axis direction). In the illustrated embodiment, the second direction (the y-axis direction) is orthogonal to the first direction (the illustrated x-axis direction), or is at least substantially orthogonal to the first direction; with the term "substantially orthogonal" meaning orthogonal to within reasonable tolerances of fabrication and measurement. In other embodiments, the slit-opening-location 38 may extend along a direction which crosses the first direction of the boundary edges 37 and 39, but which is not substantially orthogonal to such first direction.

Doped-semiconductor-material 40 is provided within the intermediate region 14. The doped-semiconductor-material 40 is illustrated with stippling to assist the reader in visualizing such material.

The doped-semiconductor-material 40 is configured to include a first portion 42 along the boundary edge 37 of the intermediate region, a second portion 46 along the slit-opening location 38, and a third portion 44 along the boundary edge 39 of the intermediate region. In some embodiments, the portions 42 and 44 may be referred to as first and second portions, and the portion 46 may be referred to as a belt portion extending between the first and second portions 42 and 44. In the illustrated embodiment, the doped-semiconductor-material 40 is provided as a substantially H-shaped structure 48. The portions 42, 44 and 46 may be considered to be a first leg region (first leg portion), a second leg region (second leg portion), and a belt region (belt portion), respectively, of such substantially H-shaped structure. The term "substantially H-shaped" means that the shape generally conveys an H-type configuration to a viewer. The first and second legs may or may not be the same length as one another, and the belt region may or may not be centrally located relative to one or both of the first and second legs.

The illustrated H-shaped structure 48 may be a fragment of a much larger configuration of the doped-semiconductor-material 40. For instance, there may be multiple slit-opening-locations in addition to the location 38, with such slit-opening-locations being laterally offset relative to one another. There may be multiple belt portions extending between the first and second portions 42 and 44, with each of the belt portions being under one of the slit-opening-locations.

Figure 5A:
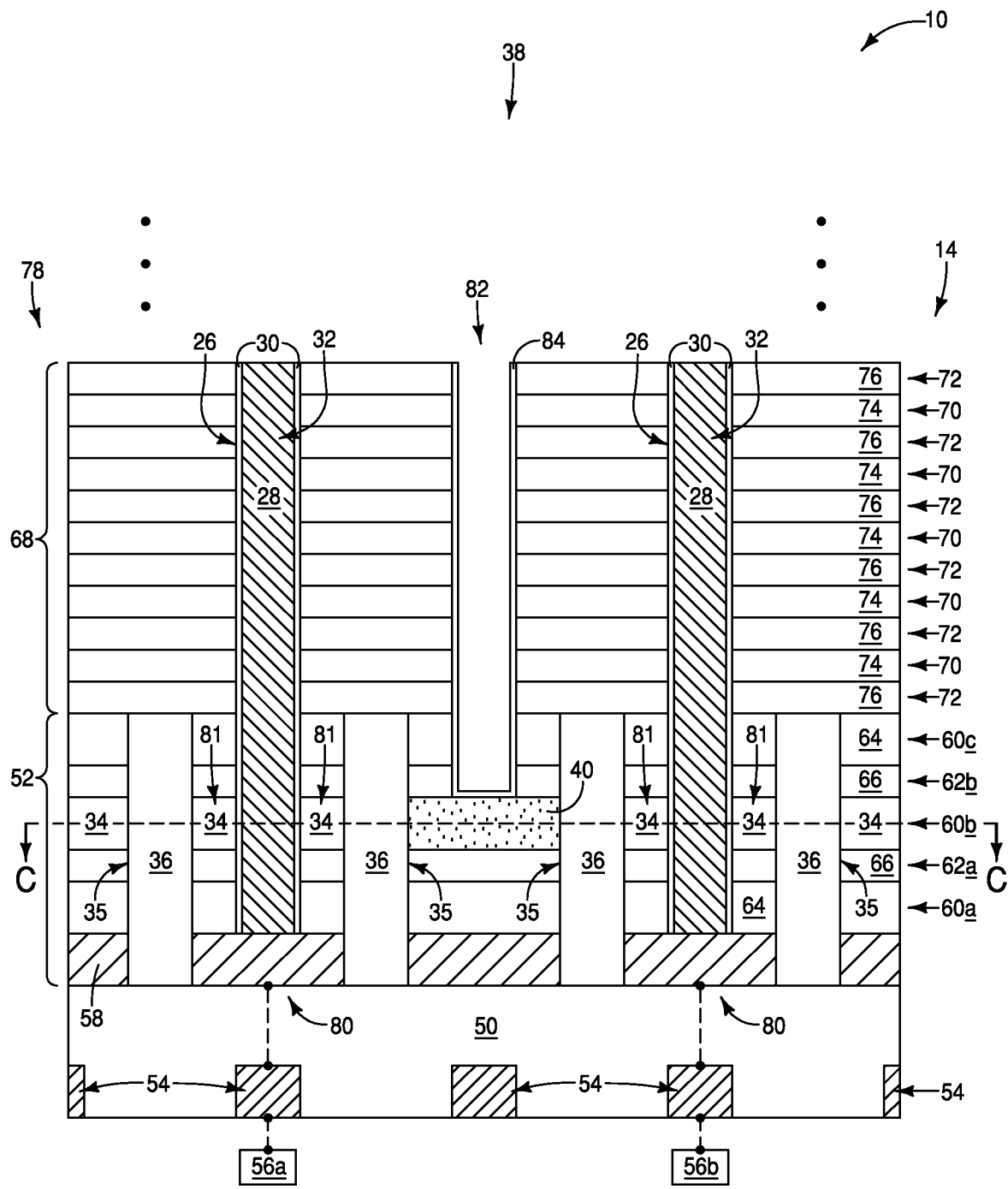
Figure 5B:
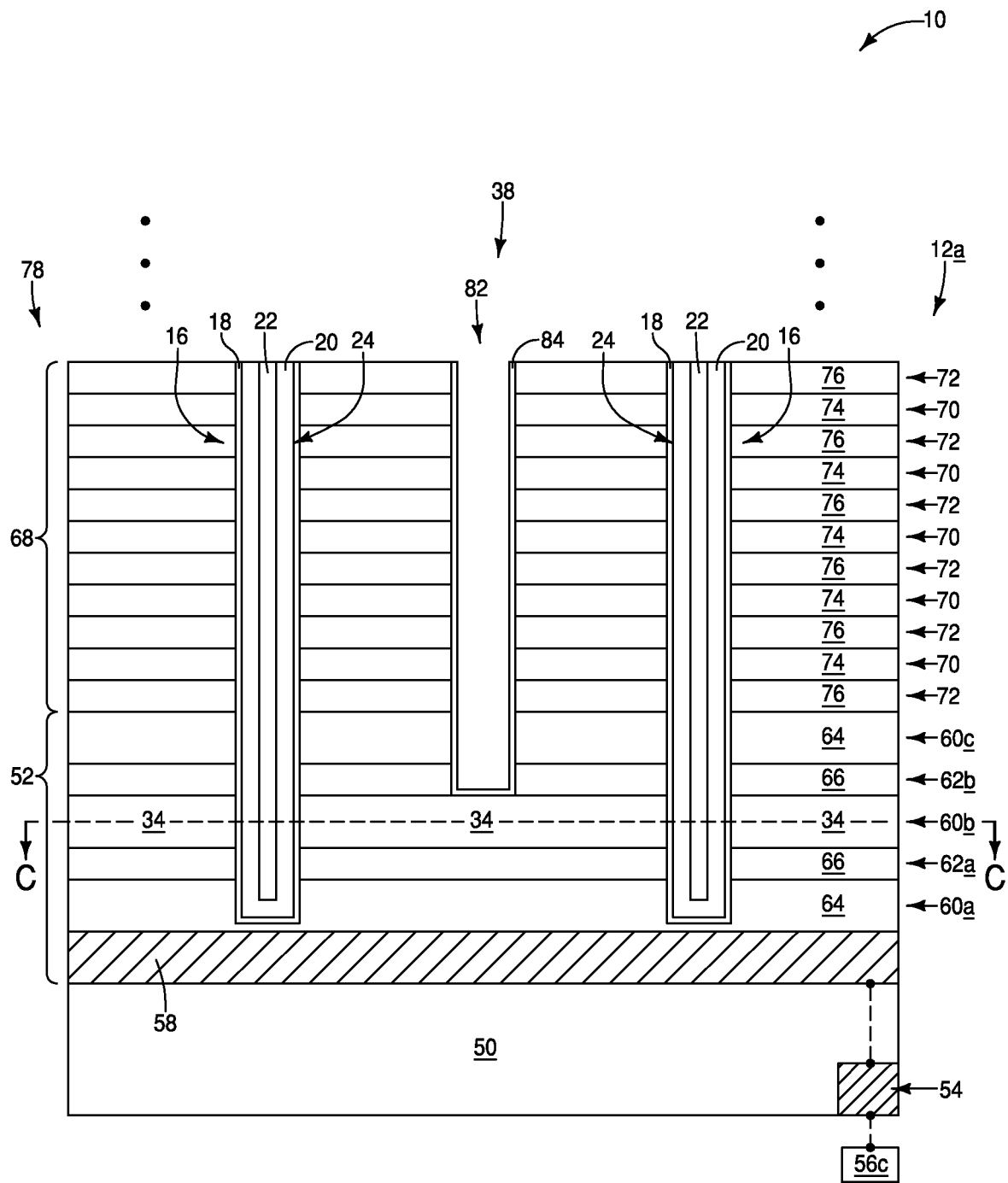

FIGS. 5A and 5B show cross-sectional side-views within the intermediate region 14 and the memory region 12*a*, respectively. The view of FIG. 5A is along the line A-A of FIG. 5, and the view of FIG. 5B is along the line B-B of FIG. 5. The view of FIG. 5 is along the lines C-C of FIGS. 5A and 5B. The views of FIGS. 5A and 5B diagrammatically illustrate example structures represented in the top-down view of FIG. 5, but are not provided to the same scale as FIG. 5.

FIGS. 5A and 5B show an example configuration in which an insulative material 50 forms a supporting structure for a stack 52.

The insulative material 50 may comprise any suitable composition(s), and in some embodiments may comprise, consist essentially of, or consist of silicon dioxide.

In the illustrated embodiment, conductive structures 54 are within the insulative material 50. The conductive structures 54 may comprise any suitable conductive material; such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

One or more of the conductive structures 54 may be coupled with logic circuitry (e.g., CMOS) provided beneath the insulative material 50. FIG. 5A shows the logic circuitry including components 56*a* and 56*b*, which may correspond to, for example, control circuitry and/or sensing circuitry (e.g., sense-amplifier-circuitry, driver circuitry, etc.). FIG. 5B shows the logic circuitry configured to include a component 56*c* (e.g., control circuitry) coupled with a source structure.

The logic circuitry 56 may be supported by a semiconductor material (not shown). Such semiconductor material may, for example, comprise, consist essentially of, or consist of monocrystalline silicon (Si). The semiconductor material may be referred to as a semiconductor base, or as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The configurations described herein may be referred to as integrated configurations supported by a semiconductor substrate, and accordingly may be considered to be integrated assemblies.

The stack 52 may be referred to as a first stack, and may be considered to extend across the memory regions (12*a* and 12*b*) and the intermediate region (14) of FIG. 5. The stack 52 includes an electrically conductive material 58 (which may be considered to be configured as conductive structures within the regions 12*a*, 12*b* and 14), and includes regions 60 and 62 over the conductive material 58. The regions 60 may be referred to as semiconductor-material-containing regions.

In the illustrated embodiment, there are three of the regions 60, and such regions are labeled as 60*a*, 60*b* and 60*c*. The regions 60*a* and 60*c* include semiconductor material 64. Such semiconductor material may comprise conductively-doped semiconductor material, such as, for example, conductively-doped silicon. In some embodiments, the silicon may be n-type doped, and accordingly may be doped with one or both of phosphorus and arsenic. The conductively-doped silicon of regions 60*a* and 60*c* may be doped to a concentration of at least about $10^{22}$ atoms/cm$^3$ with one or more suitable conductivity-enhancing dopant(s). The semiconductor material within the region 60*a* may be the same as that within the region 60*c*, as shown, or may be different than that within the region 60*c*.

The central-semiconductor-material-containing region 60*b* includes the materials 34 and 40 described above with reference to FIG. 5. In some embodiments, the materials 34 and 40 may comprise the same semiconductor material, with material 40 corresponding to a relatively-doped-portion of such semiconductor material, and with material 34 corresponding to a relatively-undoped-portion of such material. The relatively-doped-portion 40 comprises a higher concentration of dopant as compared to any concentration of dopant present within the relatively-undoped-portion 34. In some embodiments, the relatively-doped-portion 40 of the central-semiconductor-material-containing region 60*b* includes a total dopant concentration within a range of from about $10^{15}$ atoms/cm$^3$ to about $10^{25}$ atoms/cm$^3$, within a range of from about $10^{18}$ atoms/cm$^3$ to about $10^{22}$ atoms/cm$^3$, etc. The dopant within the relatively-doped-portion 40 is utilized to change etch characteristics of the portion 40 relative to those of the portion 34 at a subsequent process stage (described below with reference to FIGS. 7A and 7B). The dopant provided within the relatively-doped-portion 40 may be any suitable dopant, and in some embodiments may comprise one or more of carbon, phosphorus, arsenic, boron, nitrogen, oxygen and gallium. In some embodiments, the relatively-doped-portion 40 may comprise, consist essentially of, or consist of boron-doped silicon.

The regions 60*a*-*c* may be considered to be vertically-stacked one atop another, with the region 60*b* being a central semiconductor-material-containing region which is vertically between the regions 60*a* and 60*c*.

Intervening regions 62 alternate with the semiconductor-material-containing regions 60 within the stack 52. The regions 62 comprise material 66. The material 66 may be insulative, conductive, etc. In some embodiments, the material 66 may be insulative and may comprise, consist essentially of, or consist of one or more of silicon dioxide, aluminum oxide, hafnium oxide, silicon nitride, silicon oxynitride, etc. The regions 62*a* and 62*b* may comprise the same composition as one another (as shown), or may comprise different compositions relative to one another. One or both of the regions 62 may comprise a homogeneous composition (as shown) or may comprise a laminate of two or more different compositions.

Although the stack 52 is shown comprising three of the semiconductor-material-containing regions 60 and two of the intervening regions 62, it is to be understood that the stack may comprise any suitable number of the regions 60 and 62. In some embodiments, the stack 52 may comprise at least three of the semiconductor-material-containing regions 60, and at least two of the intervening regions 62.

The regions 60 may be formed to any suitable thicknesses, and in some embodiments may be formed to thicknesses within a range of from about 100 nanometers (nm) to about 300 nm. The regions 62 may be formed to any suitable thicknesses, and in some embodiments may be formed to thicknesses within a range of from about 5 nm to about 20 nm.

A second stack 68 is formed over the first stack 52. The second stack 68 has alternating first and second levels 70 and 72. The first levels 70 comprise a material 74, and the second levels 72 comprise a material 76. The materials 74 and 76 may comprise any suitable compositions. In some embodiments, the material 74 may comprise, consist essentially of, or consist of silicon nitride; and the material 76 may comprise, consist essentially of, or consist of silicon dioxide. The material 74 may be referred to as a sacrificial material, and the material 76 may be referred to as an insulative material.

The stacks 52 and 68 may be considered together to be part of a construction 78. In the shown embodiment, such construction also includes the material 36 configured as the annular rings 35. Such annular rings subdivide the conductive material 58 into islands 80, with some of such islands being coupled with the CMOS circuitry 56 in the illustrated embodiment of FIG. 5A.

The posts 26 are formed to extend through the first stack 68, through the regions 60 and 62 of the second stack 52, and to the conductive material 58, as shown in FIG. 5A. The posts 26 include the conductive posts 32, and in the shown embodiment such conductive posts are electrically coupled with the conductive islands 80 formed from the conductive material 58. The conductive posts 32 may be coupled to the CMOS circuitry 56 in embodiments in which the conductive posts 32 are "live" posts. Alternatively, at least some of the conductive posts 32 may not be coupled to the CMOS circuitry in embodiments in which the conductive posts are "dummy" configurations provided for structural support rather than for electrical connections.

In the shown embodiment, each of the islands 80 supports one of the conductive posts 32. In other embodiments, at least one of the islands 80 may support two or more of the conductive posts. Also, in the shown embodiment each of the posts 26 includes a conductive post 32. In other embodiments, one or more of the posts 26 may only include insulative material, particularly if such posts are provided only for structural support.

The annular rings 35 of the insulative material 36 laterally surround lower regions of the conductive posts 32. In some embodiments, the annular rings 35 may be considered to be outer rings, and may be considered to laterally surround inner rings 81 of the undoped semiconductor material 34 (with such inner rings 81 being labeled in both the cross-sectional side view of FIG. 5A, and the top-down view of FIG. 5). The rings 35 are shown to be square-shaped, but may have any suitable shapes in other embodiments, including, for example, circular shapes, elliptical shapes, rectangular shapes, etc.

The cell-material-pillars 16 are formed to extend through the first stack 68 and partially into the second stack 52, as shown in FIG. 5B. In the shown embodiment, the cell-material-pillars 16 extend into the lower region 60a of the stack 52, but do not extend to the conductive material 58. The cell-material-pillars 16 comprise the cell materials 18, the channel-material-pillars 24, and the dielectric material 22.

In some embodiments, portions of the stack 52 within the memory regions 12a and 12b (including the illustrated region of FIG. 5B) may ultimately correspond to a source structure analogous to the source structures described above with reference to the prior art of FIGS. 1-4.

FIGS. 5A and 5B show a slit-opening 82 formed along the slit-opening-location 38. The slit-opening passes through the first stack 68, and into the second stack 52. In the illustrated embodiment, the slit-opening stops on the relatively-doped-semiconductor material 40 (as shown in FIG. 5B). In other embodiments, the slit-opening may extend into the material 40.

In the shown embodiment, the slit-opening has sidewall surfaces which are substantially vertically straight; with the term "substantially vertically straight" meaning vertically straight to within reasonable tolerances of fabrication and measurement. In other embodiments the sidewall surfaces of the slit-opening may be tapered.

Protective material 84 is formed within the slit-opening 82, and along the sidewall surfaces of the slit-opening. The protective material 84 may comprise any suitable composition(s). In some embodiments, the protective material 84 may comprise, consist essentially of, or consist of silicon; and specifically may comprise silicon which is effectively undoped (e.g., comprising an intrinsic dopant concentration, and in some embodiments comprising a dopant concentration of less than or equal to about $10^{16}$ atoms/cm$^3$). In some embodiments, the protective material 84 may comprise one or more of metal (e.g., tungsten, titanium, etc.), metal-containing material (e.g., metal silicide, metal nitride, metal carbide, metal boride, etc.) and semiconductor material (e.g., silicon, germanium, etc.).

The illustrated regions of the assembly 10 shown in FIGS. 5A and 5B are lower portions of the assembly, and it is to be understood that the assembly may include many more levels of the stack 68 than are illustrated in FIGS. 5A and 5B.

Figure 6A:
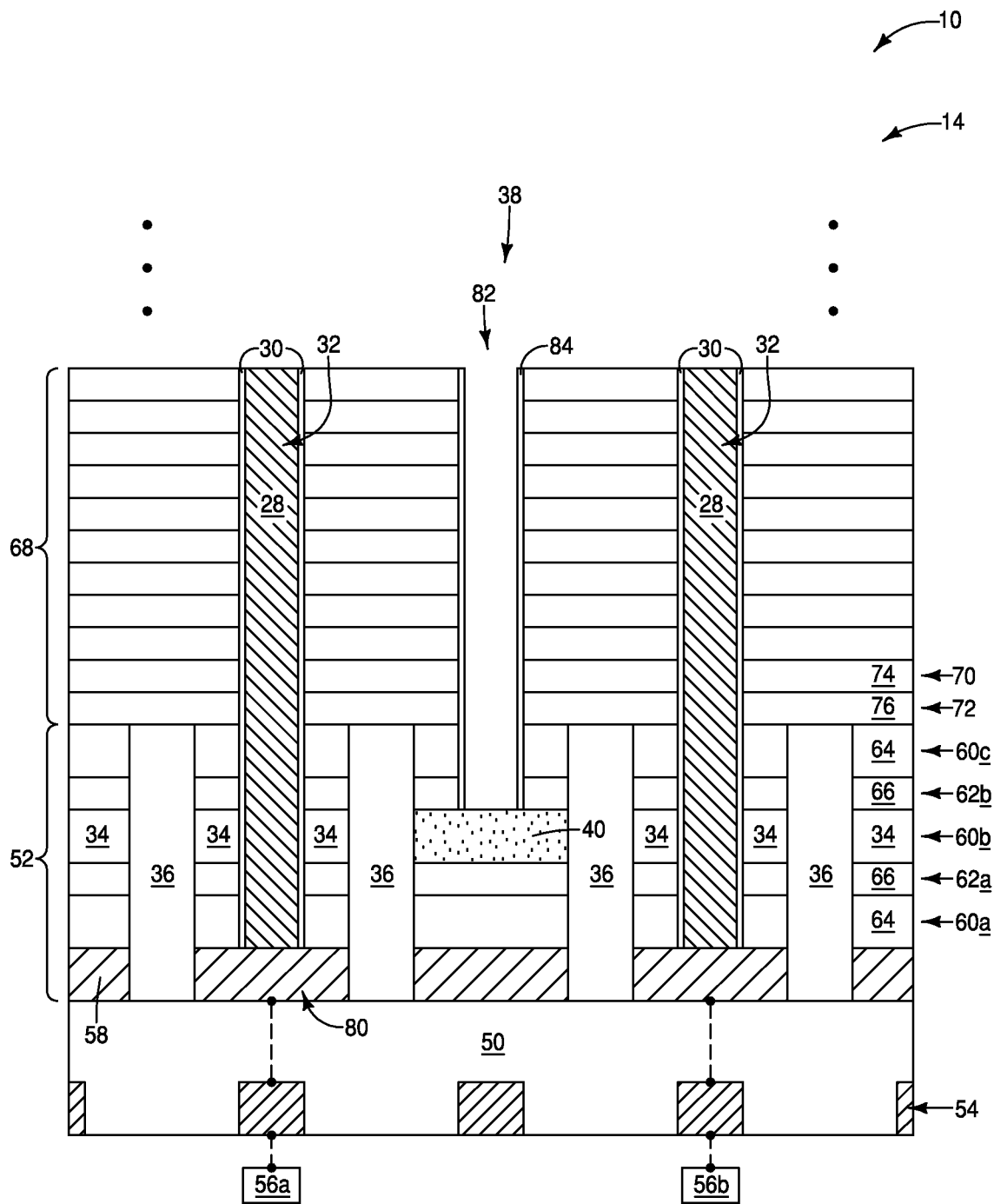
FIGS. 6A and 6B are diagrammatic cross-sectional side views of the regions of the example integrated assembly of FIGS. 5-5B at an example process stage following that of FIGS. 5-5B. The cross-sectional side views of FIGS. 6A and 6B are along the same cross-sections as FIGS. 5A and 5B, respectively.
Figure 6B:
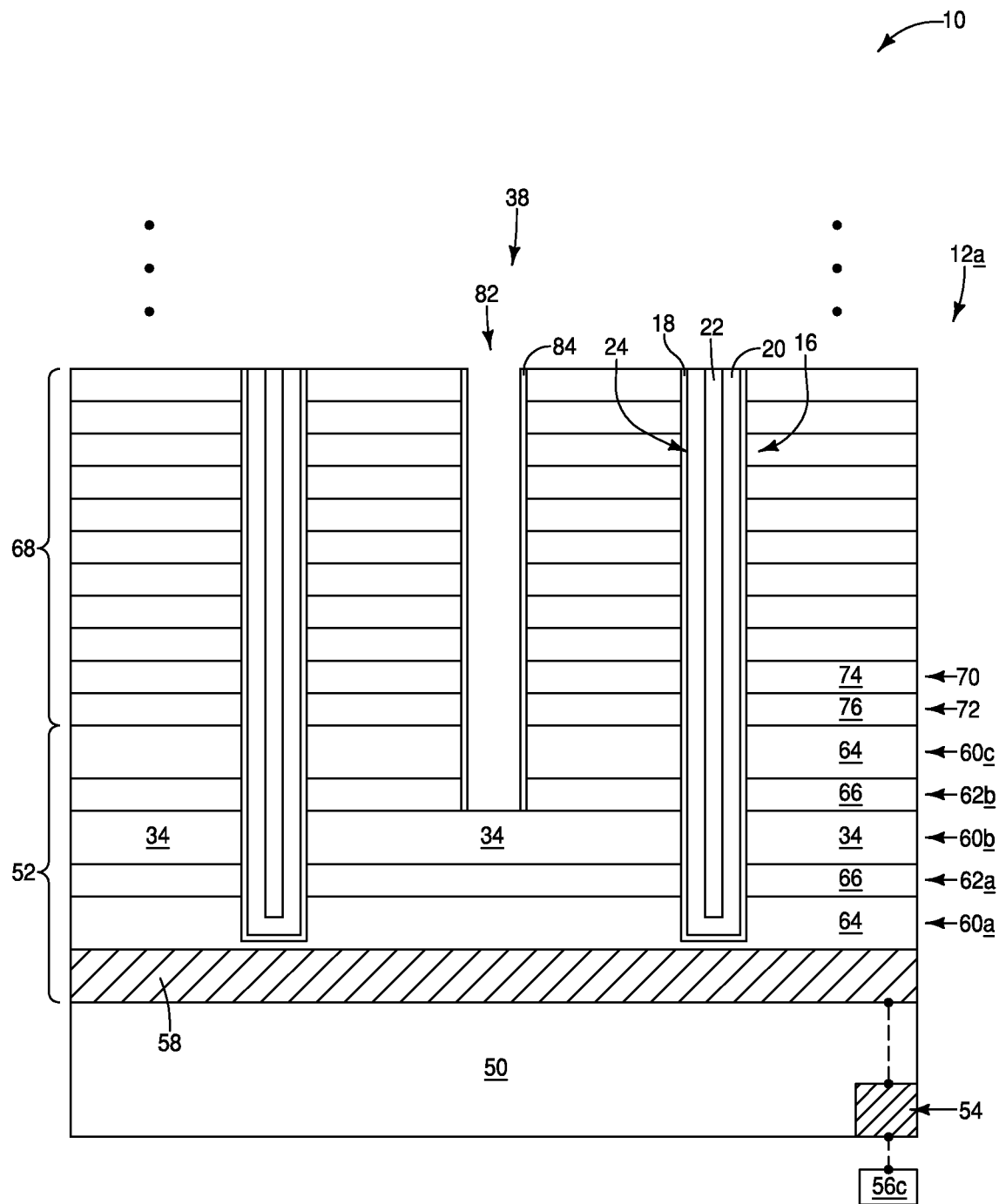

Referring to FIGS. 6A and 6B, one or more etches are utilized to punch through the protective material 84 at the bottom of the slit-opening 82 to expose the central semiconductor-material-containing region 60b of the first stack 52. The slit-opening 82 extends across the memory regions and intermediate region of FIG. 5 (the regions 12a, 12b and 14). Accordingly, the removal of the protective material 84 from the bottom of the slit-opening 82 exposes the relatively-undoped-material (relatively-undoped-portion) 34 within the memory regions (e.g., the memory region 12a of FIG. 6B) and also exposes the relatively-doped-material (relatively-doped-portion) 40 within the intermediate region 14 (FIG. 6A). In the illustrated embodiment, the slit opening 82 is over the belt portion (belt region) 46 of the H-shaped structure 48 of the relatively-doped portion 40 as can be understood with reference to FIG. 5.

Figure 7A:
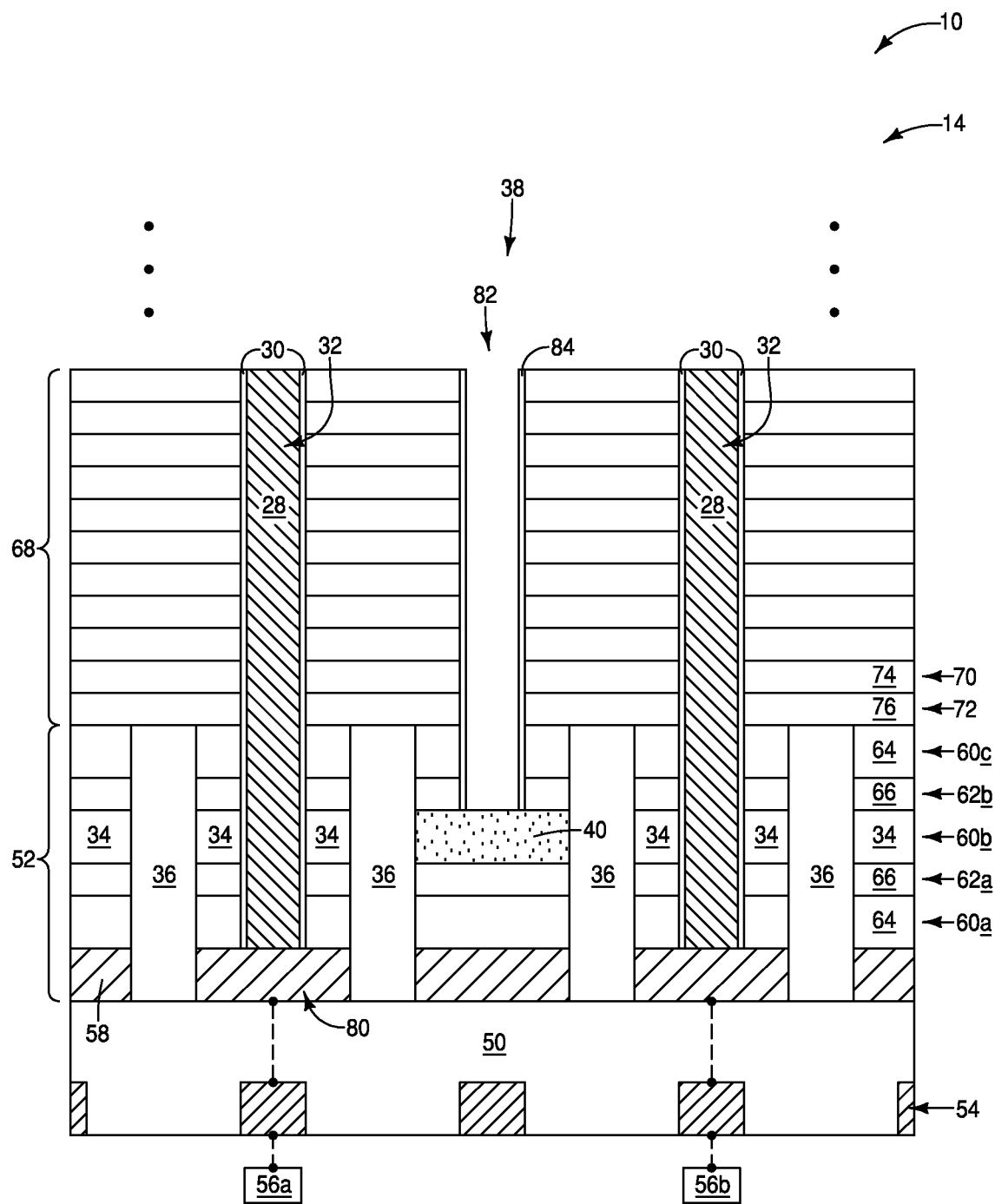
FIGS. 7A and 7B are diagrammatic cross-sectional side views of the regions of the example integrated assembly of FIGS. 5-5B at an example process stage following that of FIGS. 6A and 6B. The cross-sectional side views of FIGS. 7A and 7B are along the same cross-sections as FIGS. 5A and 5B, respectively.
Figure 7B:
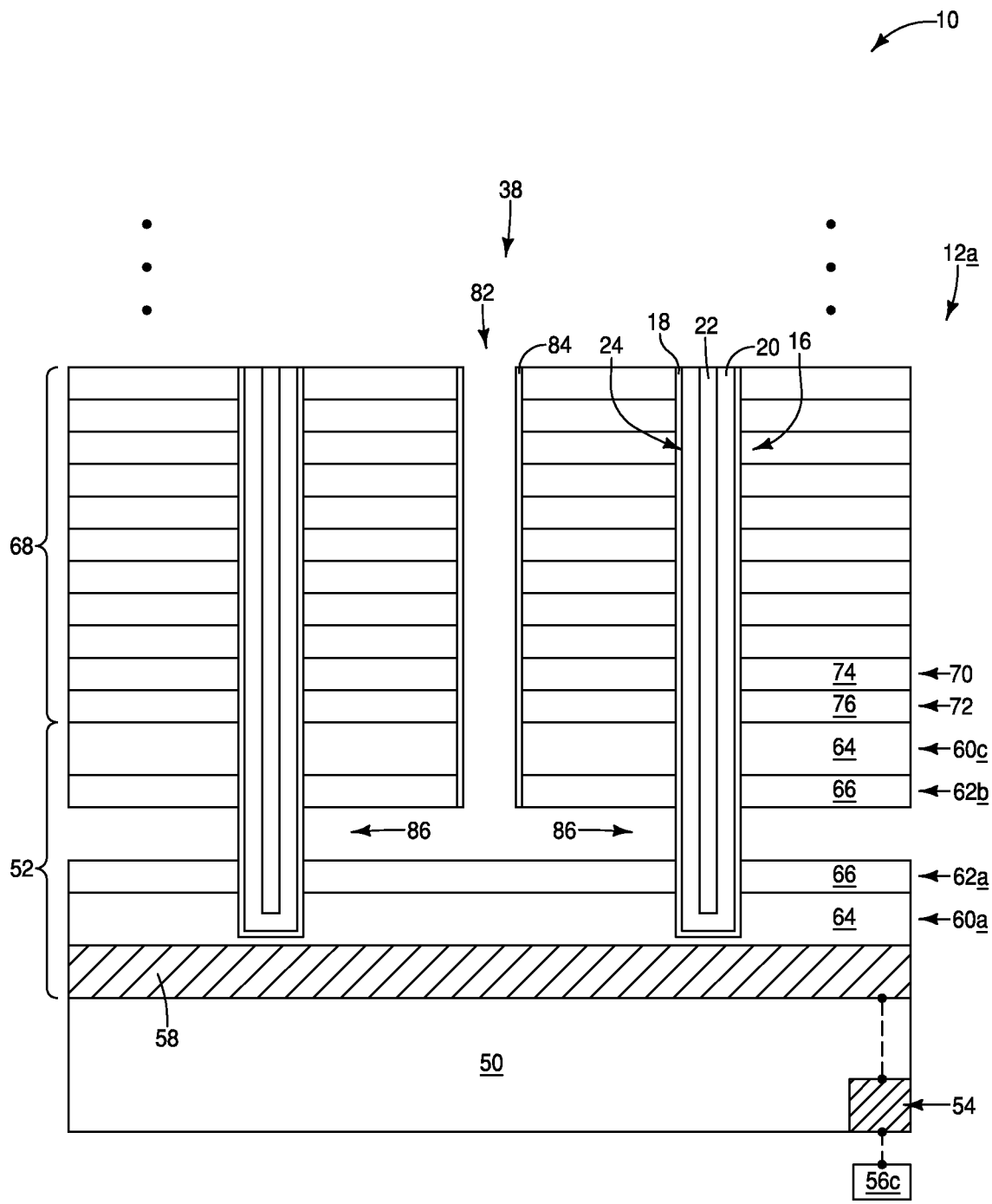

Referring to FIG. 7B, the relatively-undoped semiconductor-material 34 (FIG. 6B) of the central semiconductor-material-containing region 60b is removed to form conduits 86. The conduits 86 are formed within the memory regions 12a and 12b (with memory region 12a being shown in the cross-sectional view of FIG. 7B). The conduits 86 may be formed with any suitable processing, and in some embodiments may be formed utilizing one or more etchants containing hydrofluoric acid. In the shown embodiment, the intervening regions 62a and 62b remain after formation of the conduits 86. In other embodiments, such intervening regions may be removed during formation of the conduits, depending on the composition(s) of the intervening regions and of the etchant(s) utilized to remove the material 34.

FIG. 7A shows the intermediate region 14 at the same process stage as the memory region 12a of FIG. 7B, and shows that the relatively-doped-semiconductor-material 40 is resistant to the etchants utilized to form the conduits 86 in the memory regions (e.g., the region 12a of FIG. 7B). In some embodiments, the relatively-undoped-semiconductormaterial 34 exposed within the slit 82 may be considered to be selectively removed relative to the relatively-doped-semiconductor-material 40 exposed within the slit 82. For purposes of interpreting this disclosure and the claims that follow, a first material is considered to be selectively removed relative to a second material if the first material is removed faster than the second material; which may include, but which is not limited to, conditions which are 100% selective for the first material relative to the second material.

The H-shaped configuration of the relatively-doped-semiconductor-material 40 (shown in the top-down view of FIG. 5) protects the materials 30, 34 and 36 of the intermediate region 14 from being exposed to the etchants utilized to remove the material 34 from the memory regions 12a and 12b. Accordingly, the materials 30, 34 and 36 remain intact in the intermediate region 14 to provide isolation between the conductive posts 32.

Figure 8A:
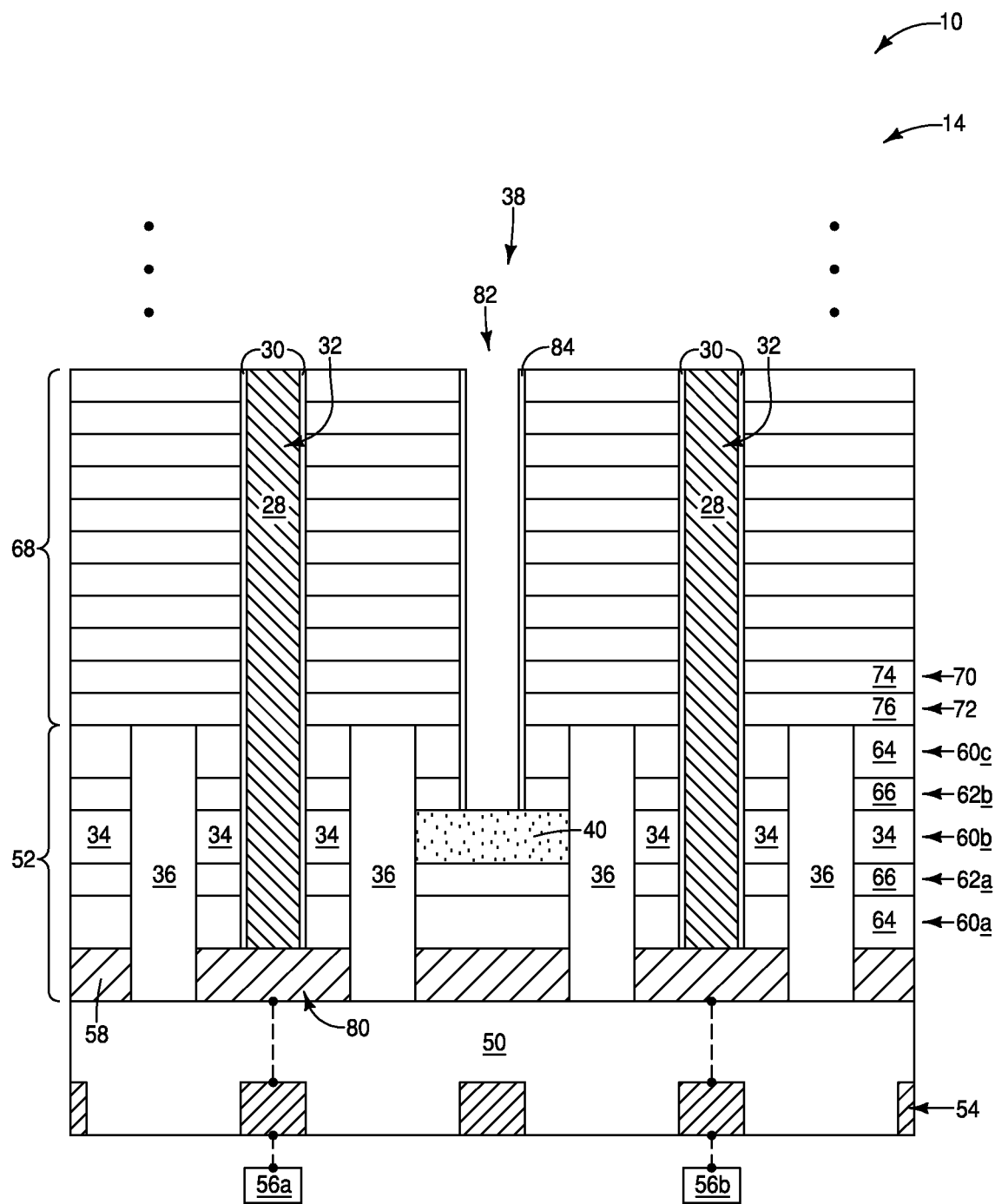
FIGS. 8A and 8B are diagrammatic cross-sectional side views of the regions of the example integrated assembly of FIGS. 5-5B at an example process stage following that of FIGS. 7A and 7B. The cross-sectional side views of FIGS. 8A and 8B are along the same cross-sections as FIGS. 5A and 5B, respectively.
Figure 8B:
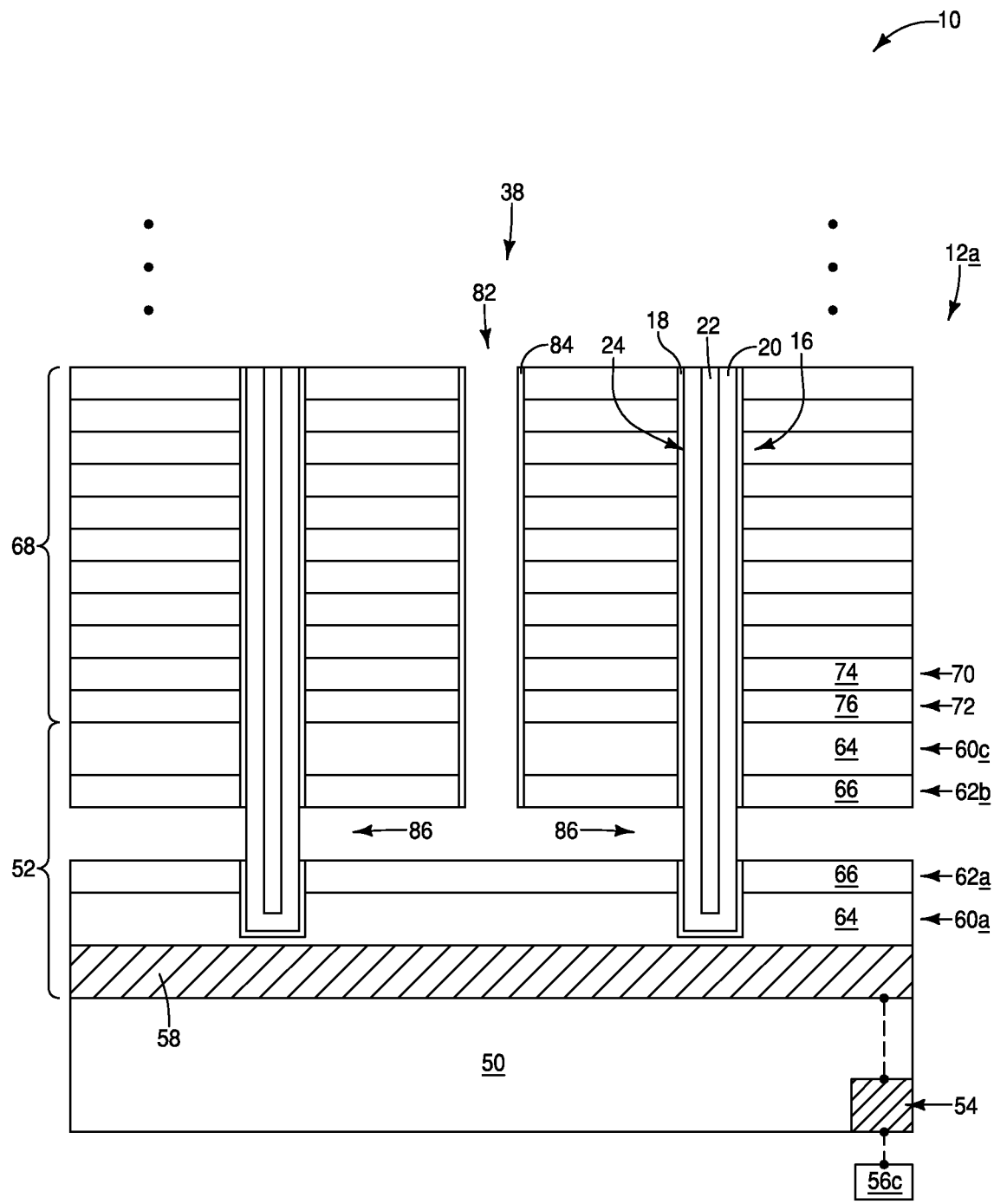

Referring to FIG. 8B, the conduits 86 are extended through the cell materials 18 to expose sidewall surfaces of the semiconductor material (channel material) 20. FIG. 8A shows that no substantial change occurs within the intermediate region 14 during the extension of the conduits 86 through the cell materials 18.

Figure 9A:
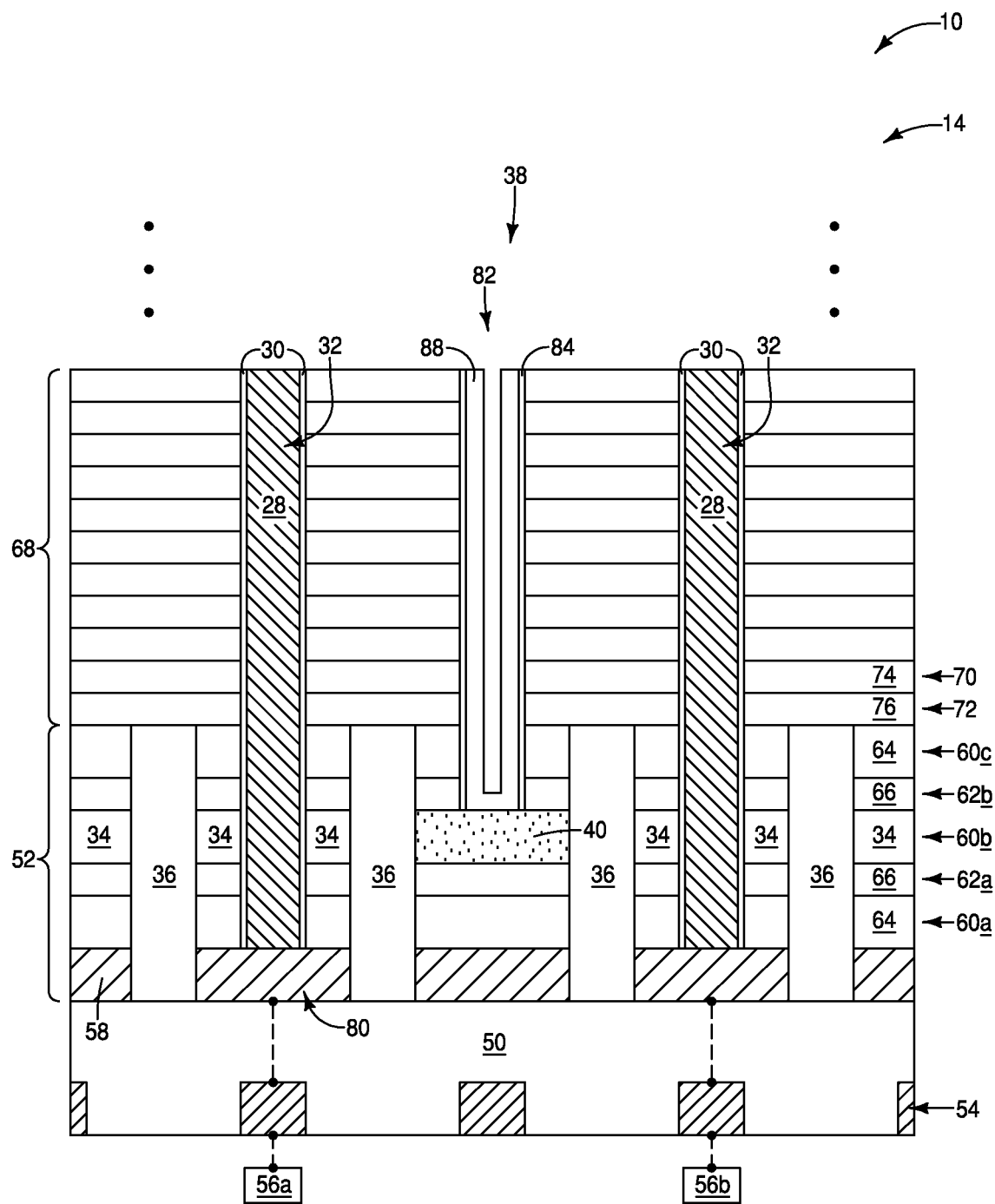
FIGS. 9A and 9B are diagrammatic cross-sectional side views of the regions of the example integrated assembly of FIGS. 5-5B at an example process stage following that of FIGS. 8A and 8B. The cross-sectional side views of FIGS. 9A and 9B are along the same cross-sections as FIGS. 5A and 5B, respectively.
Figure 9B:
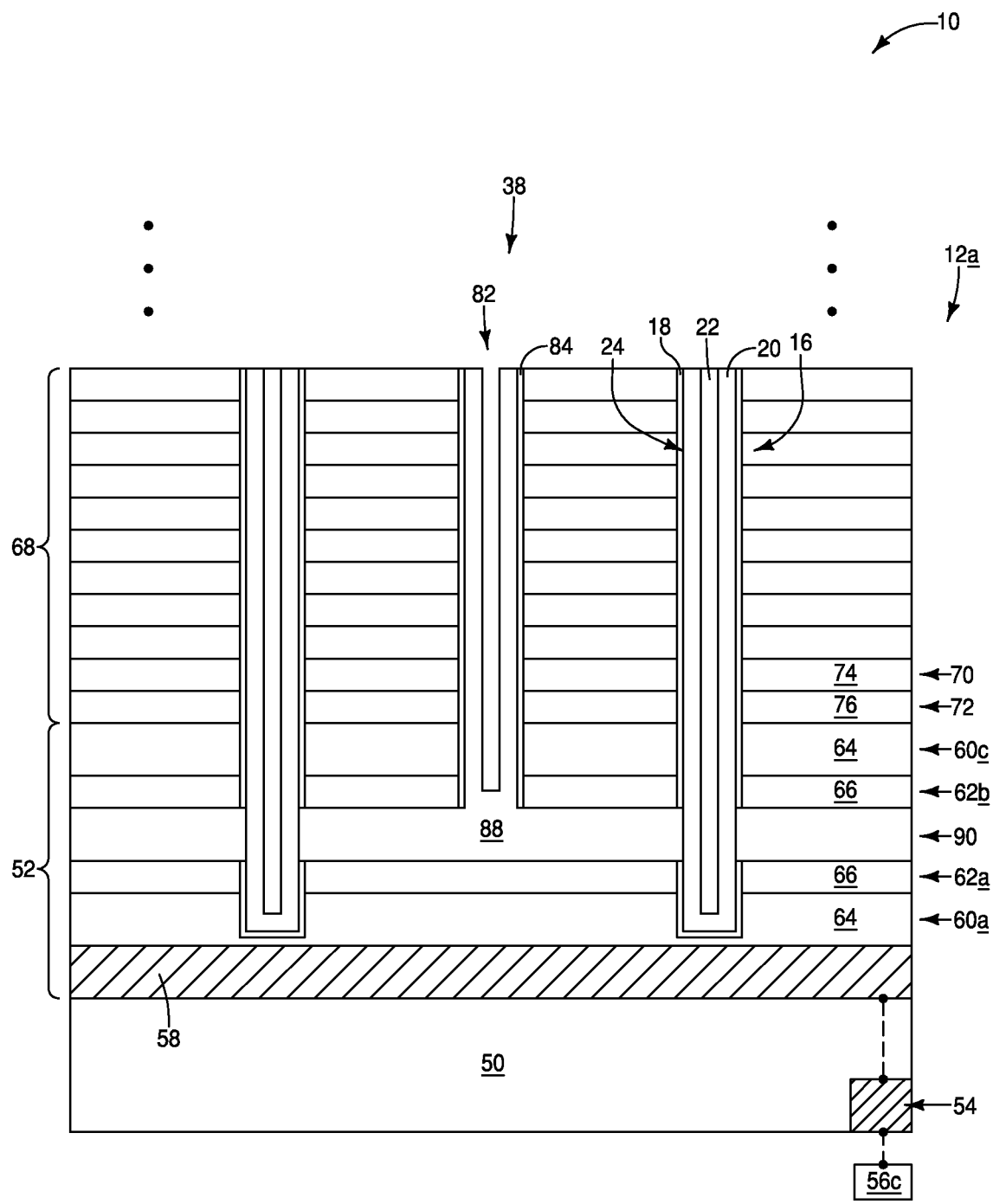

Referring to FIGS. 9A and 9B, conductively-doped-semiconductor-material 88 is formed within the conduits 86 (FIG. 8B). The semiconductor material 88 may comprise any suitable composition(s); and in some embodiments may comprise, consist essentially of, or consist of one or more of silicon, germanium, III/V semiconductor material (e.g., gallium phosphide), semiconductor oxide, etc. In some embodiments, the semiconductor material 88 may comprise silicon which is heavily doped (e.g., doped to a concentration of at least about $10^{22}$ atoms/cm$^3$) with n-type dopant (e.g., phosphorus, arsenic, etc.). The conductive material 88 may be considered to be configured as a source-structure-component 90 which is coupled with lower regions of the channel-material-pillars 24. In some embodiments, the materials within the first stack 52 of FIG. 9B may all be considered to be part of a conductive source structure. The regions 62a and 62b may be removed during the formation of the conduits 86 of FIG. 7B (as discussed above with reference to FIG. 7B) so that such regions are not part of the source structure comprising the stack 52. In some embodiments, the regions 62a and 62b may be either conductive so that they do not adversely influence electrical conduction along the source structure comprising the stack 52, or may be insulative and kept thin enough so that they do not problematically influence electrical conduction along the source structure comprising the stack 52.

The material 88 becomes the central region 60b of the stack 52 within the memory regions 12a and 12b (with the region 12a being shown in FIG. 9B), and directly contacts the channel material 20 of the channel-material-pillars 24.

In some embodiments, one of the doped materials 40 and 88 may be referred to as a first doped-semiconductor-material, and the other may be referred to as a second-doped-semiconductor-material. The doped-semiconductor-materials 40 and 88 may comprise a same semiconductor component as one another (e.g., both may comprise, consist essentially of, or consist of doped silicon), but may be doped differently relative to one another. For instance, in some embodiments the material 40 may comprise p-type-doped-silicon (e.g., boron-doped-silicon), and the material 88 may comprise n-type-doped-silicon (e.g., one or both of phosphorus-doped-silicon and arsenic-doped-silicon).

Figure 1:
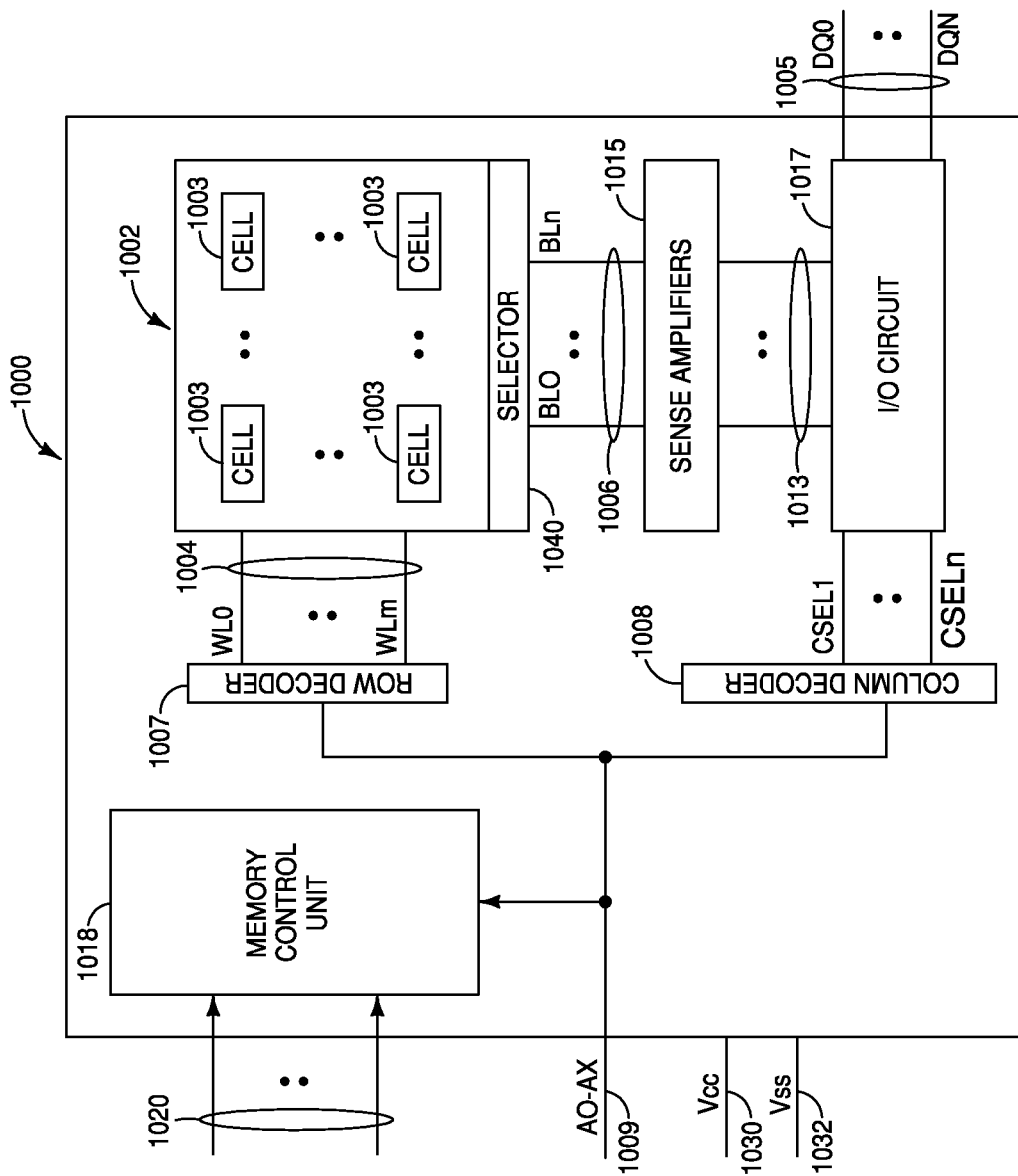
FIG. 1 shows a block diagram of a prior art memory device having a memory array with memory cells.
Figure 2:
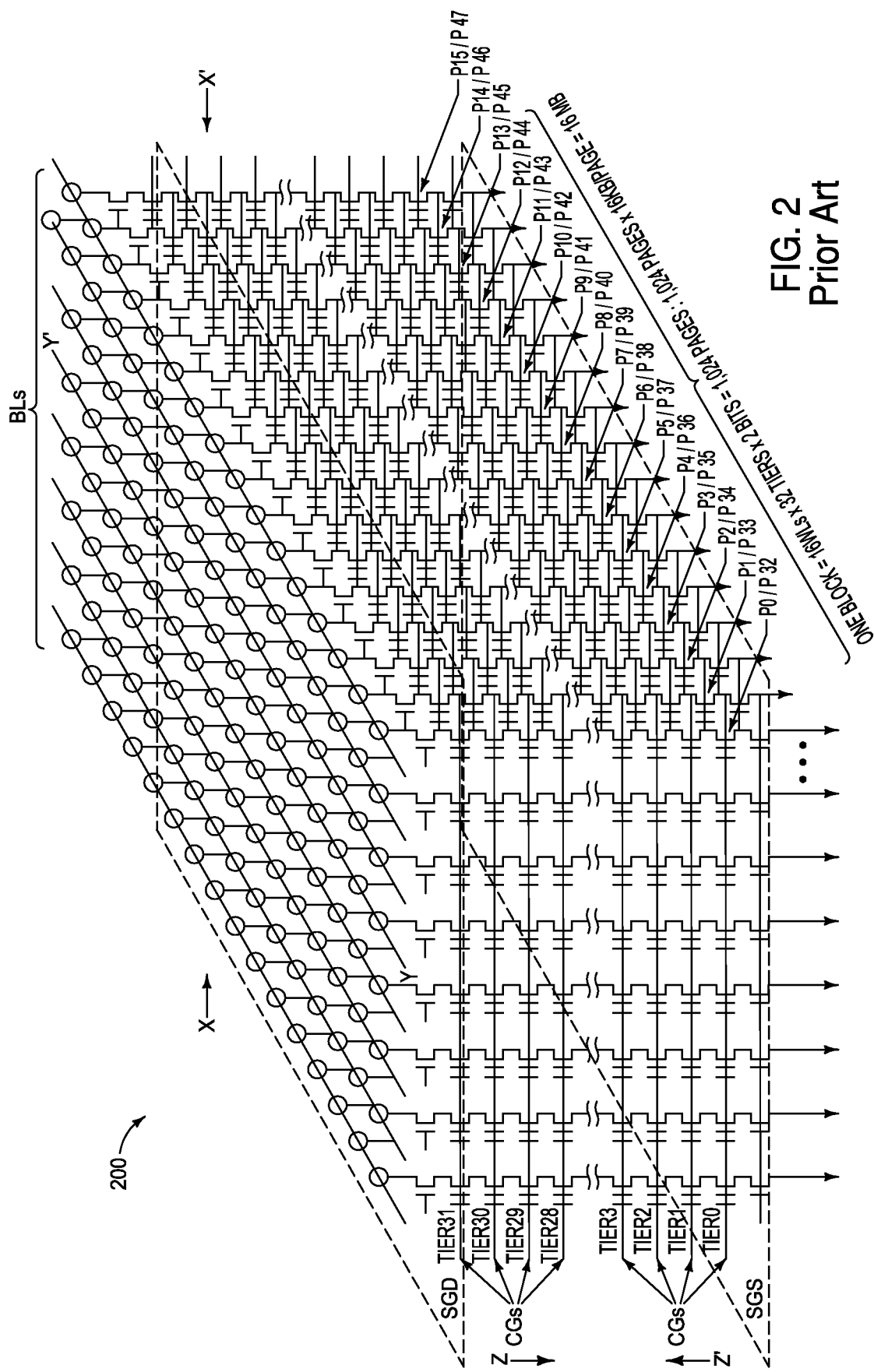
FIG. 2 shows a schematic diagram of the prior art memory device of FIG. 1 in the form of a 3D NAND memory device.
Figure 3:
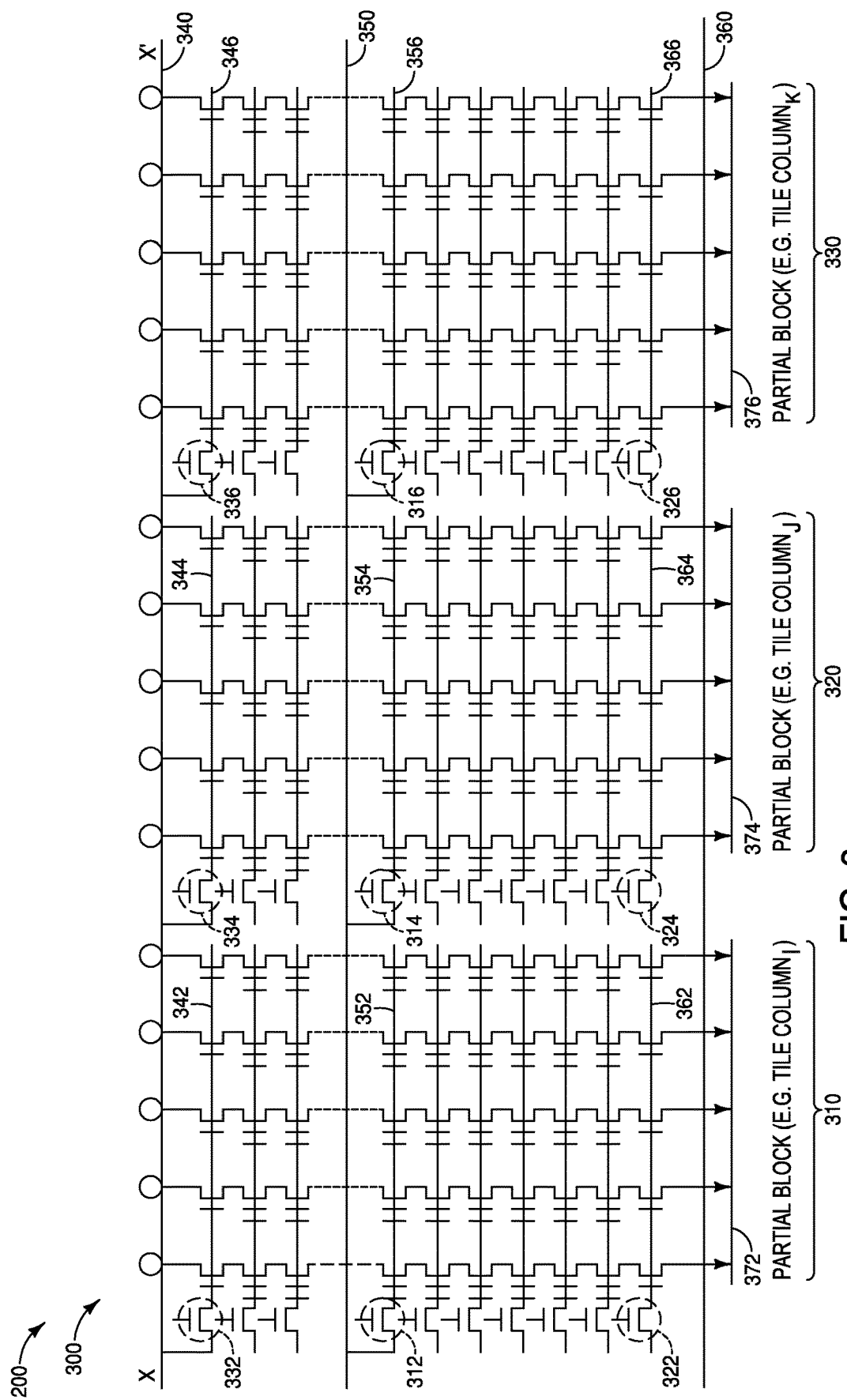
FIG. 3 shows a cross-sectional view of the prior art 3D NAND memory device of FIG. 2 in an X-X' direction.
Figure 4:
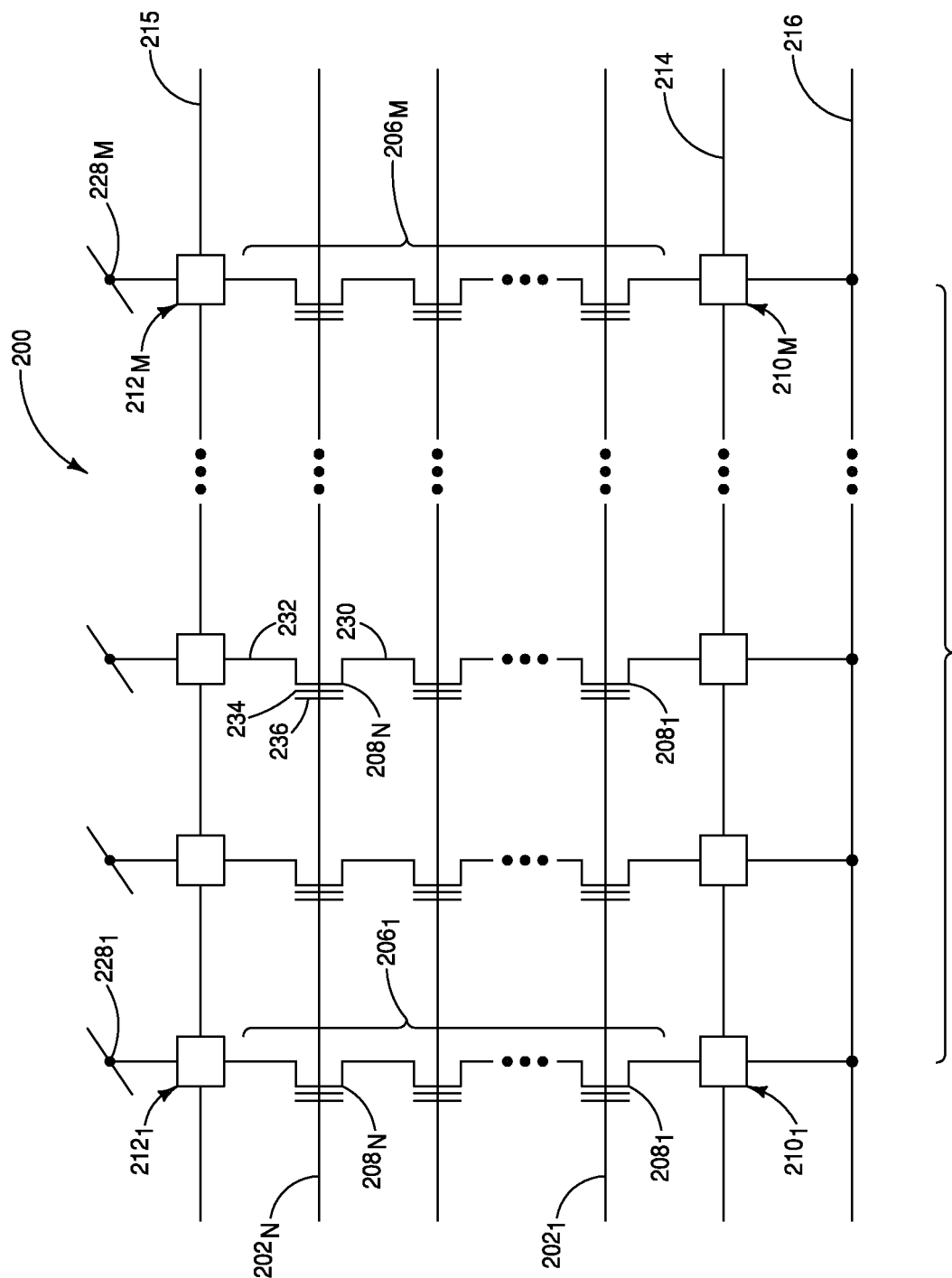
FIG. 4 is a schematic diagram of a prior art NAND memory array.
Figure 10A:
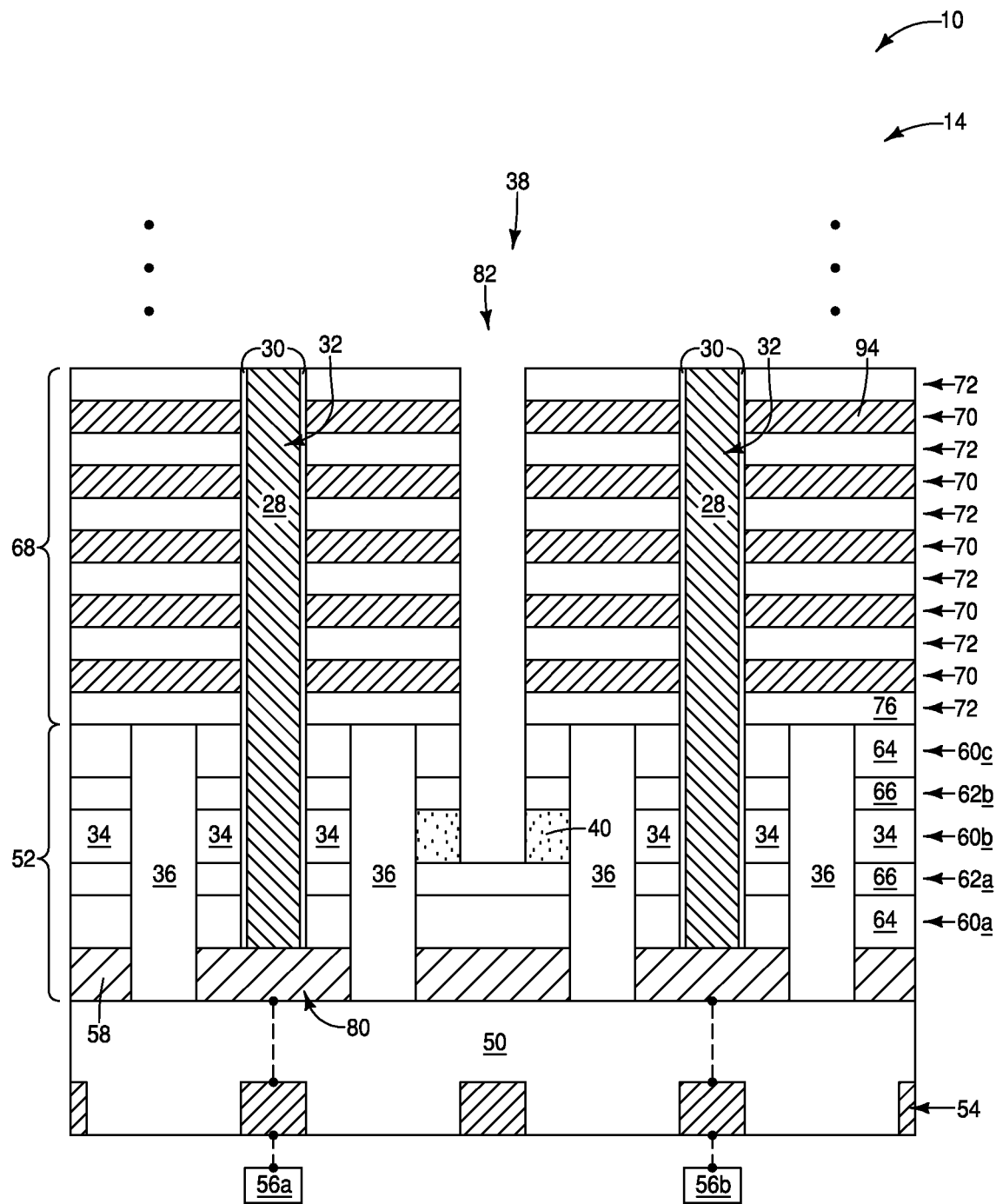
FIGS. 10A and 10B are diagrammatic cross-sectional side views of the regions of the example integrated assembly of FIGS. 5-5B at an example process stage following that of FIGS. 9A and 9B. The cross-sectional side views of FIGS. 10A and 10B are along the same cross-sections as FIGS. 5A and 5B, respectively.
Figure 10B:
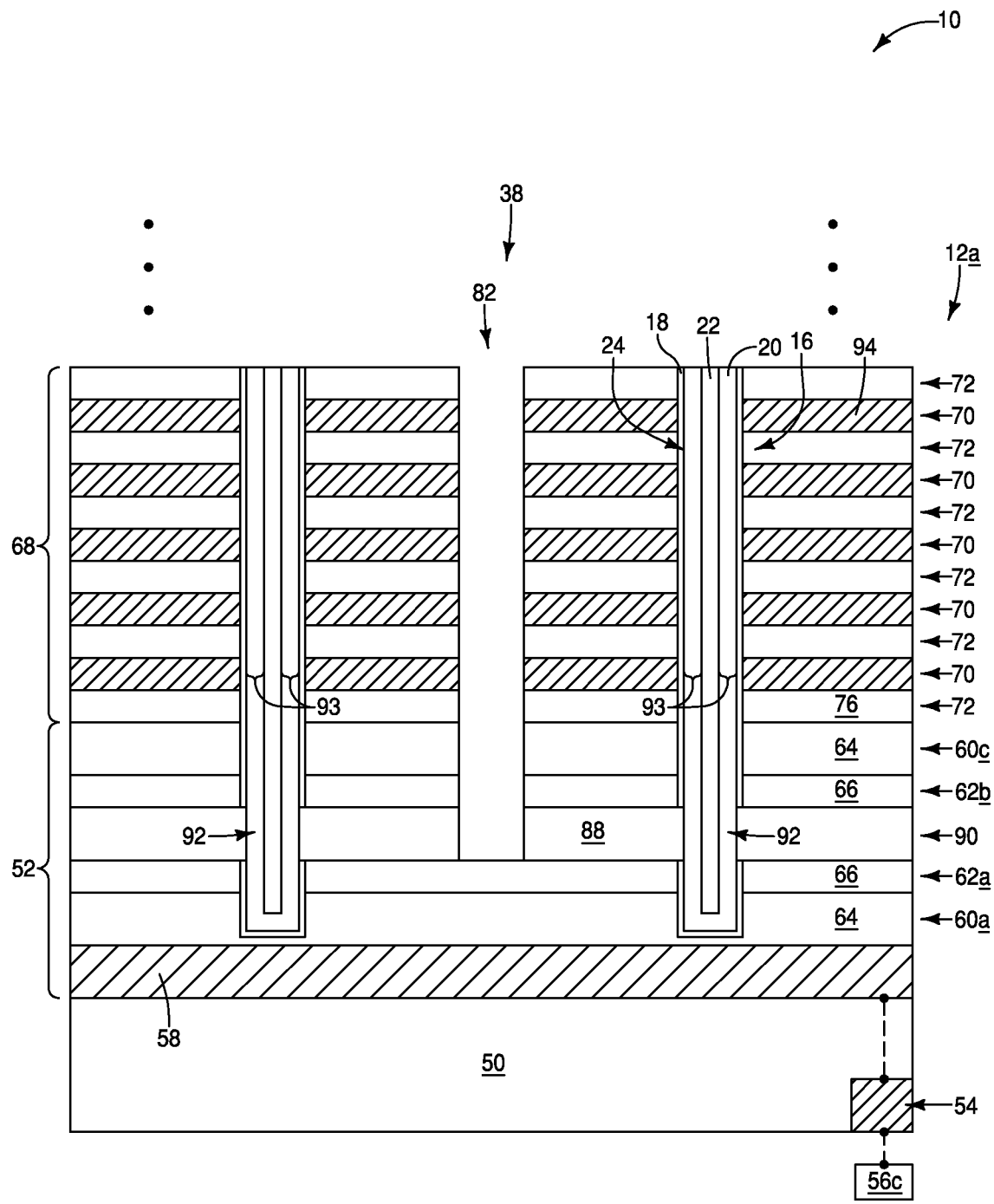
Figures 1, 10A:
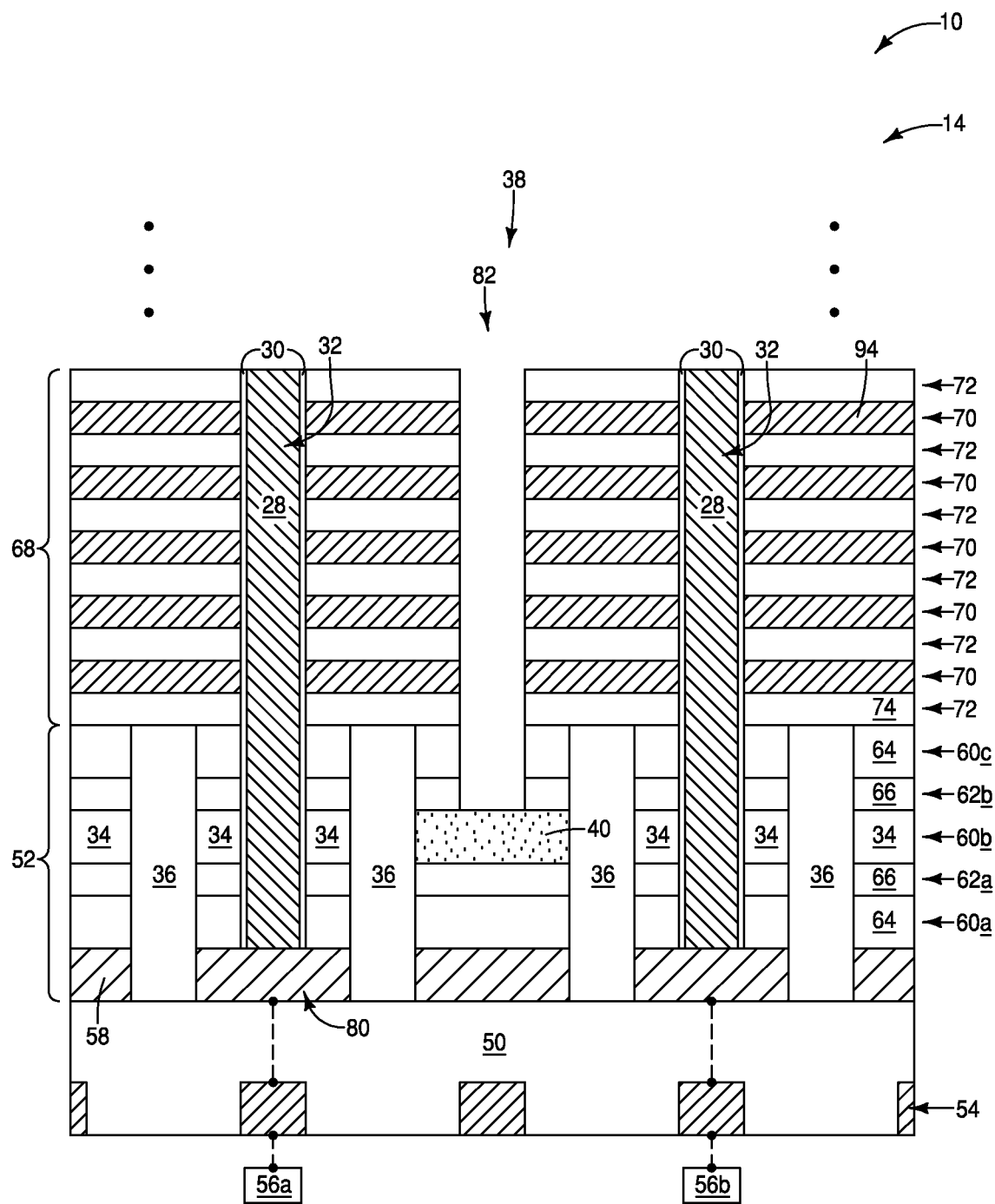

Referring to FIGS. 10A, 10B and 10A-1, the materials 84 and 88 are removed from within the opening (slit) 82 with one or more suitable etches. The materials may be removed with any suitable etchant(s). The slit-opening 82 may be punched to any suitable depth within the source structure of the stack 52. FIG. 10A shows an embodiment in which the etching extends the slit 82 into the doped material 40, and FIG. 10A-1 shows an alternative embodiment in which the etching does not extend into the doped material 40.

Dopant is out-diffused from the conductively-doped-semiconductor-material 88 into the semiconductor material (channel material) 20 to form heavily-doped regions 92 within lower portions of the channel-material-pillars 24. Lines 93 are utilized to indicate approximate upper boundaries of the dopant within the heavily-doped regions 92.

The out-diffusion from the doped material 88 into the semiconductor material 20 may be accomplished with any suitable processing, including, for example, suitable thermal processing (e.g., thermal processing at a temperature exceeding about 300° C. for a duration of at least about two minutes).

The sacrificial material 74 (FIGS. 9A and 9B) of the first levels 70 is removed and replaced with conductive material 94. Although the conductive material 94 is shown to entirely fill the first levels 70, in other embodiments at least some of the material provided within the first levels 70 may be insulative material (e.g., dielectric-blocking material).

The conductive material 94 may comprise any suitable composition(s); and in some embodiments may comprise a tungsten core at least partially surrounded by titanium nitride. The dielectric-barrier material may comprise any suitable composition(s); and in some embodiments may comprise one or more of aluminum oxide, hafnium oxide, zirconium oxide, etc.

The first levels 70 of FIGS. 10A, 10B and 10A-1 are conductive levels, and the stack 68 may be considered to comprise alternating insulative levels (intervening levels) 72 and conductive levels 70 at the process stage of FIGS. 10A, 10B and 10A-1.

Figure 11A:
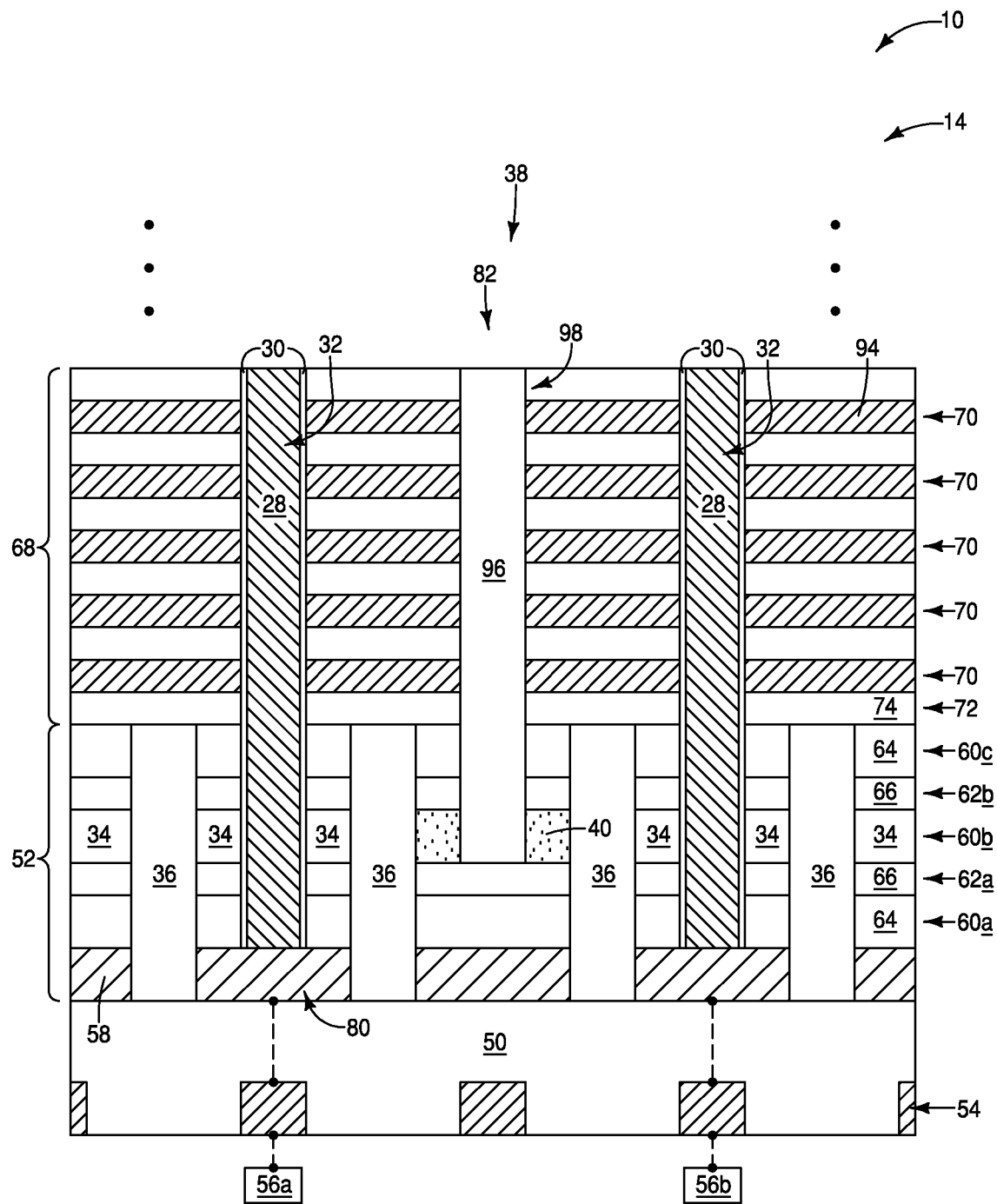
FIGS. 11A and 11B are diagrammatic cross-sectional side views of the regions of the example integrated assembly of FIGS. 5-5B at an example process stage following that of FIGS. 10A and 10B. The cross-sectional side views of FIGS. 11A and 11B are along the same cross-sections as FIGS. 5A and 5B, respectively.
Figure 11B:
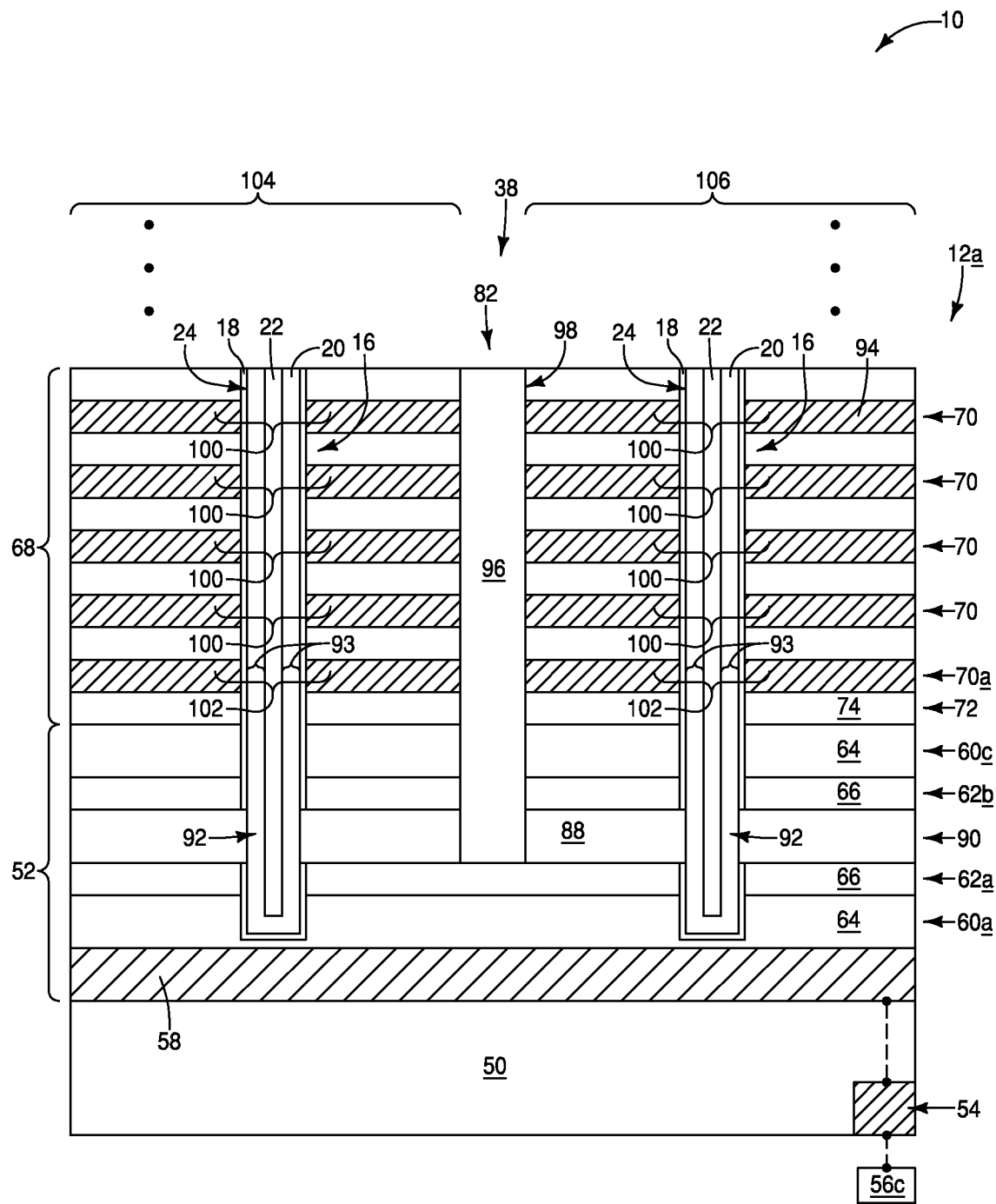
Figures 1, 11A:
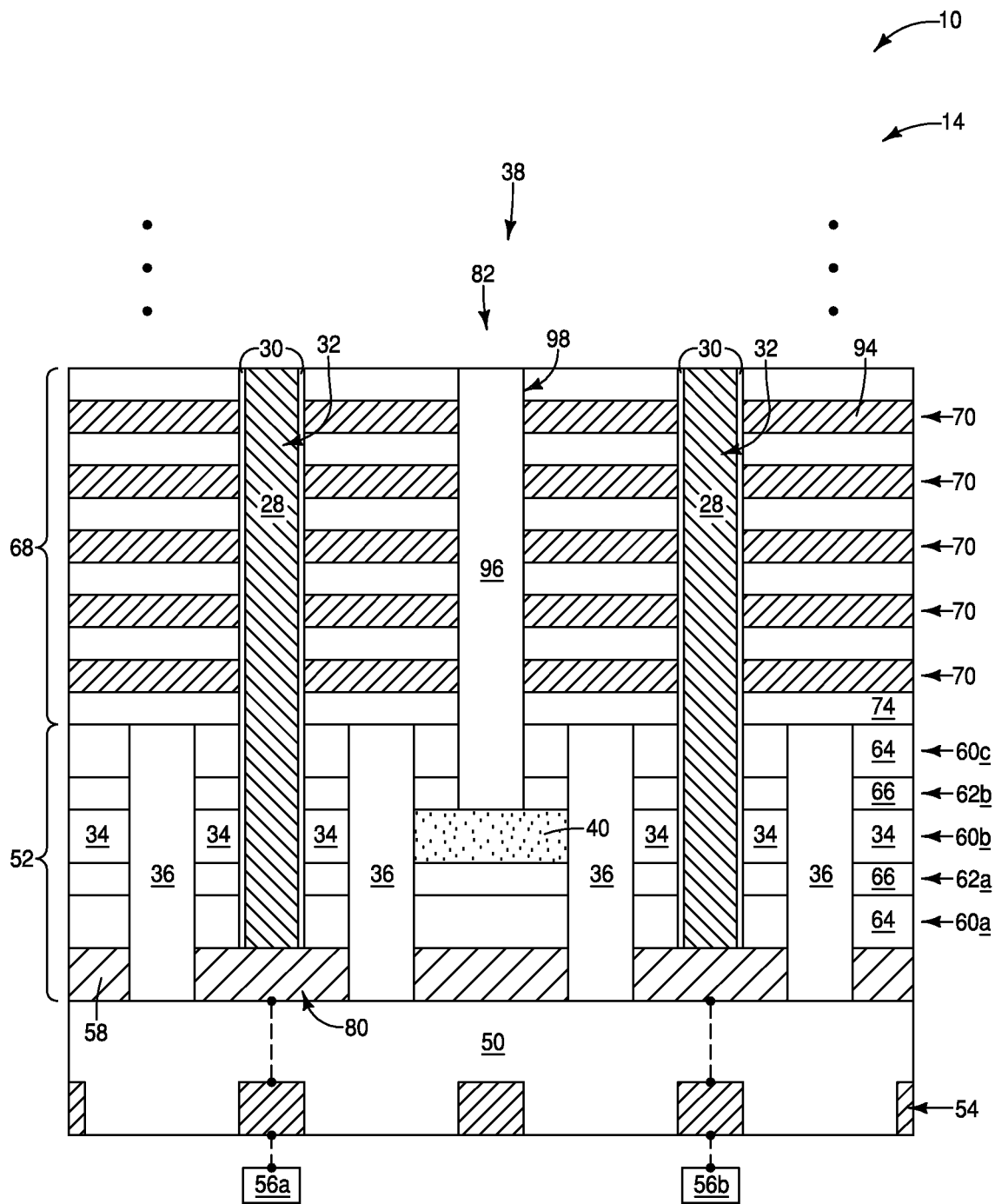

Referring to FIGS. 11A, 11B and 11A-1, panel-material 96 is formed within the slit-opening 82. The panel-material 96 may comprise any suitable composition(s); and in some embodiments may comprise, consist essentially of, or consist of silicon dioxide. Although the panel-material 96 is shown to be a single homogeneous composition, in other embodiments, the panel-material may comprise a laminate of two or more different compositions.

The panel-material 96 forms a panel 98 extending across the memory regions (e.g., 12a of FIG. 11B) and the intermediate region (the region 14 of FIGS. 11A and 11A-1).

The assembly 10 of FIG. 11B may be considered to be a memory device comprising memory cells 100 and select devices (SGS devices) 102. A lowermost of the conductive levels 70 is labeled 70a, and the doped region 92 extends to the conductive level 70a. The conductive level 70a comprises the SGS devices 102. In the shown embodiment, the dopant extends partially across the level 70a to achieve the desired balance between non-leaky OFF characteristics and leaky GIDL characteristics for the SGS devices.

Although only one of the conductive levels is shown incorporated into the SGS devices, in other embodiments multiple conductive levels may be incorporated into the SGS devices. The conductive levels may be electrically coupled with one another (ganged together) to be incorporated into long-channel SGS devices. If multiple of the conductive levels are incorporated into the SGS devices, the out-diffused dopant may extend upwardly across two or more of the conductive levels 70 which are incorporated into the SGS devices.

The memory cells 100 (e.g., NAND memory cells) are vertically-stacked one atop another. Each of the memory cells comprises a region of the semiconductor material (channel material) 20, and comprises regions (control gate regions) of the conductive levels 70. The regions of the conductive levels 70 which are not comprised by the memory cells 100 may be considered to be wordline regions (routing regions) which couple the control gate regions with driver circuitry and/or with other suitable circuitry. The memory cells 100 comprise the cell materials (e.g., the tunneling material, charge-storage material and charge-blocking material) within the regions 18.

In some embodiments, the conductive levels 70 associated with the memory cells 100 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

The source structure comprising the stack 52 may be analogous to the source structures 216 described in the "Background" section. The source structure is shown to be coupled with control circuitry (e.g., CMOS) 56c, as shown. The control circuitry may be under the source structure (as shown), or may be in any other suitable location. The source structure may be coupled with the control circuitry 56c at any suitable process stage.

In some embodiments, the channel-material-pillars 24 may be considered to be representative of a large number of substantially identical channel-material-pillars extending across the memory region 12a of FIG. 11B; with the term "substantially identical" meaning identical to within reasonable tolerances of fabrication and measurement. The panel 98 may divide the pillars between a first block region 104 and a second block region 106. Accordingly, the memory cells 100 on one side of the panel 98 may be considered to be within the first block region 104, and the memory cells 100 on the other side of the panel 98 may be considered to be within the second block region 106. The block regions 104 and 106 may be analogous to the memory blocks (or memory sub-blocks) described above in the "Background" section of this disclosure.

Figure 12A:
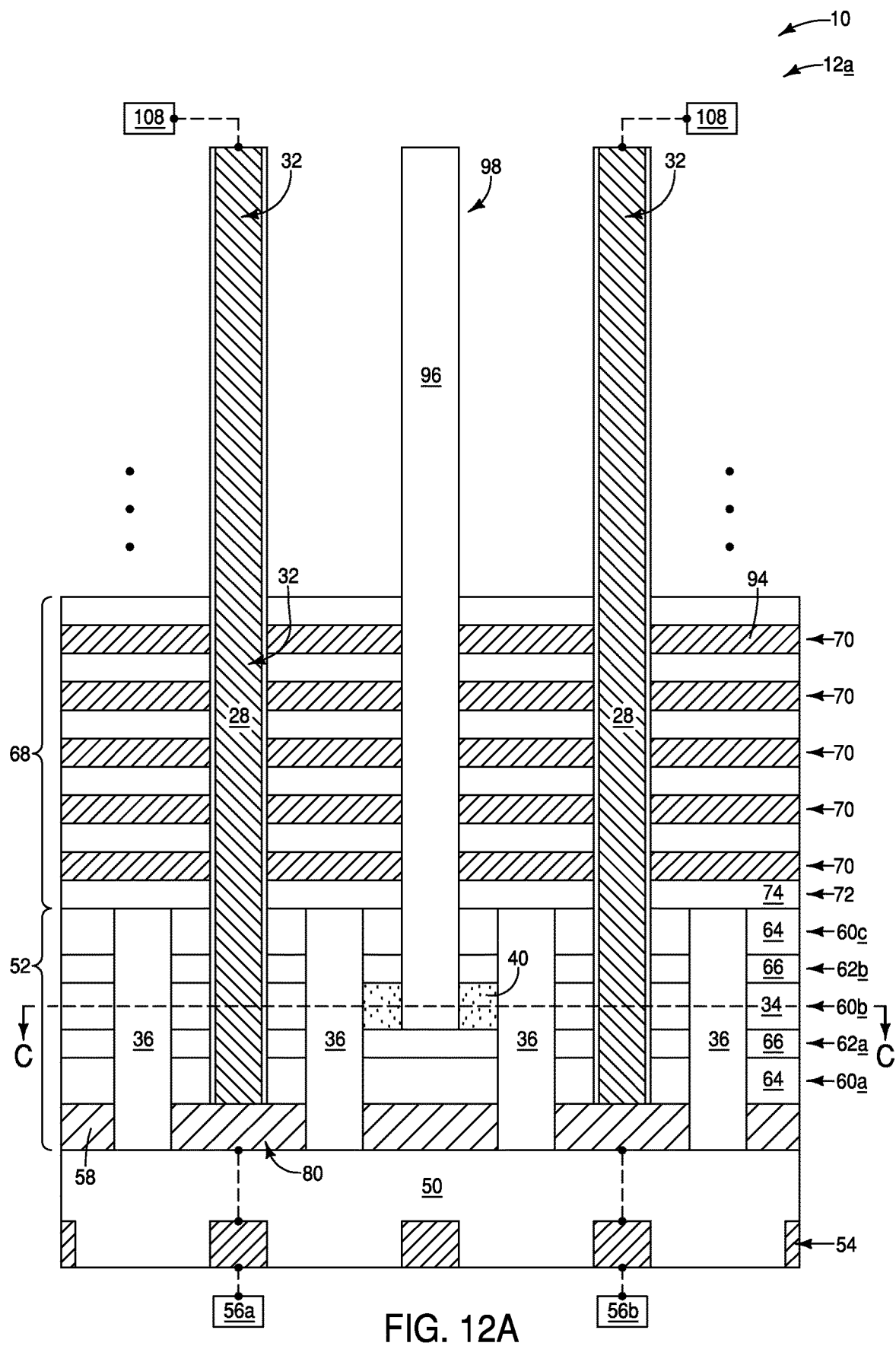
FIGS. 12A and 12B are diagrammatic cross-sectional side views of the regions of the example integrated assembly of FIGS. 11A and 11B, and show additional vertically-extended regions of such assembly besides those shown in FIGS. 11A and 11B.
Figure 12B:
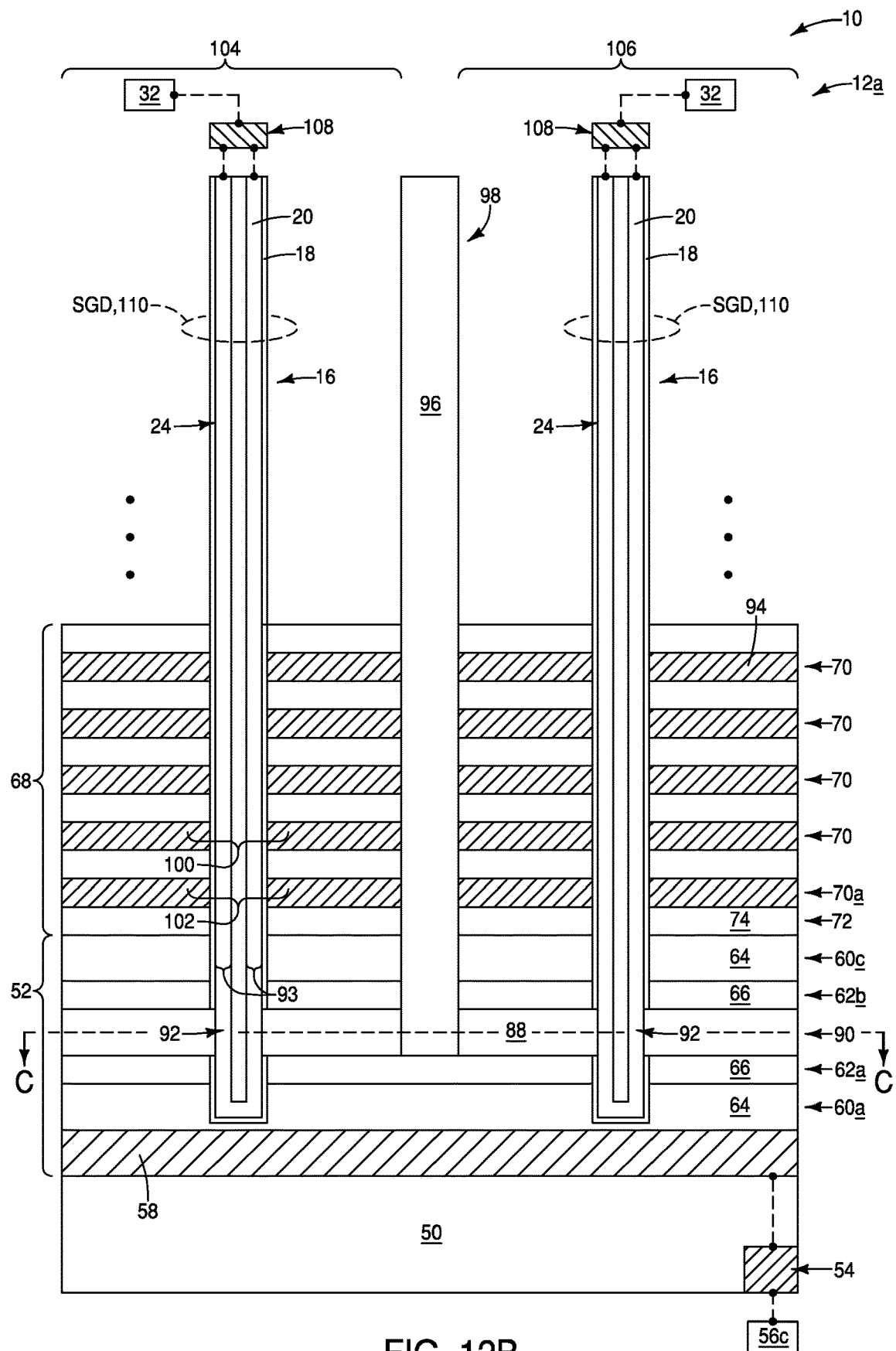

FIGS. 12A and 12B show the configuration of FIGS. 11A and 11B, and show various structures (e.g., the panels 98, the conductive posts 32, and the cell-material-pillars 16) vertically-extended and coupled with additional circuit elements. The stacks 68 may be vertically-extended to extend along substantial portions of the structures 98, 32 and 16.

The cell-material pillars 16 of FIG. 12B extend upwardly to bitlines 108. SGD devices 110 are diagrammatically illustrated as being adjacent the upper regions of the pillars 16, and beneath the bitlines 108.

The bitlines 108 may extend in and out of the page relative to the cross-sectional view of FIG. 12B.

The pillars 16, bitlines 108, SGD devices 110, SGS devices 102 and memory cells 100 may be together considered to form NAND-type configurations analogous to those described above with reference to FIGS. 1-4.

The bitlines 108 are indicated to be coupled to the conductive posts 32 in the view of FIG. 12B, and the conductive posts 32 are indicated to be coupled with the bitlines 108 in the view of FIG. 12A. Accordingly, in some embodiments the bitlines 108 associated with the memory region 12a may be coupled to the sensing circuitry (e.g., 56a and 56b) through the conductive posts 32 associated with the intermediate region 14.

The bitlines 108 are examples of components that may be associated with the cell-material-pillars 16 and coupled with logic circuitry through the conductive posts 32. In other embodiments, other components may be coupled to logic circuitry through some one or more of the conductive posts 32, either in addition to, or alternatively to, the bitlines. For instance, the SGD devices 110 may be coupled to the logic circuitry through the conductive posts 32, and in such embodiments the logic circuitry may include control circuitry for controlling the SGD devices. Generally, one or more components may be operatively proximate to the cell-material-pillars 16 (and/or the channel-material-pillars 24), and may be coupled to the logic circuitry 56 through the conductive posts 32.

FIG. 12A shows a configuration analogous to that of FIG. 11A in which the panel 98 passes through the doped-semiconductor-material 40. FIG. 12A-1 shows a similar configuration, but the configuration of FIG. 12A-1 is analogous to that of FIG. 11A-1 and comprises the panel 98 stopping at an upper surface of the doped-semiconductor-material 40.

Figure 12C:
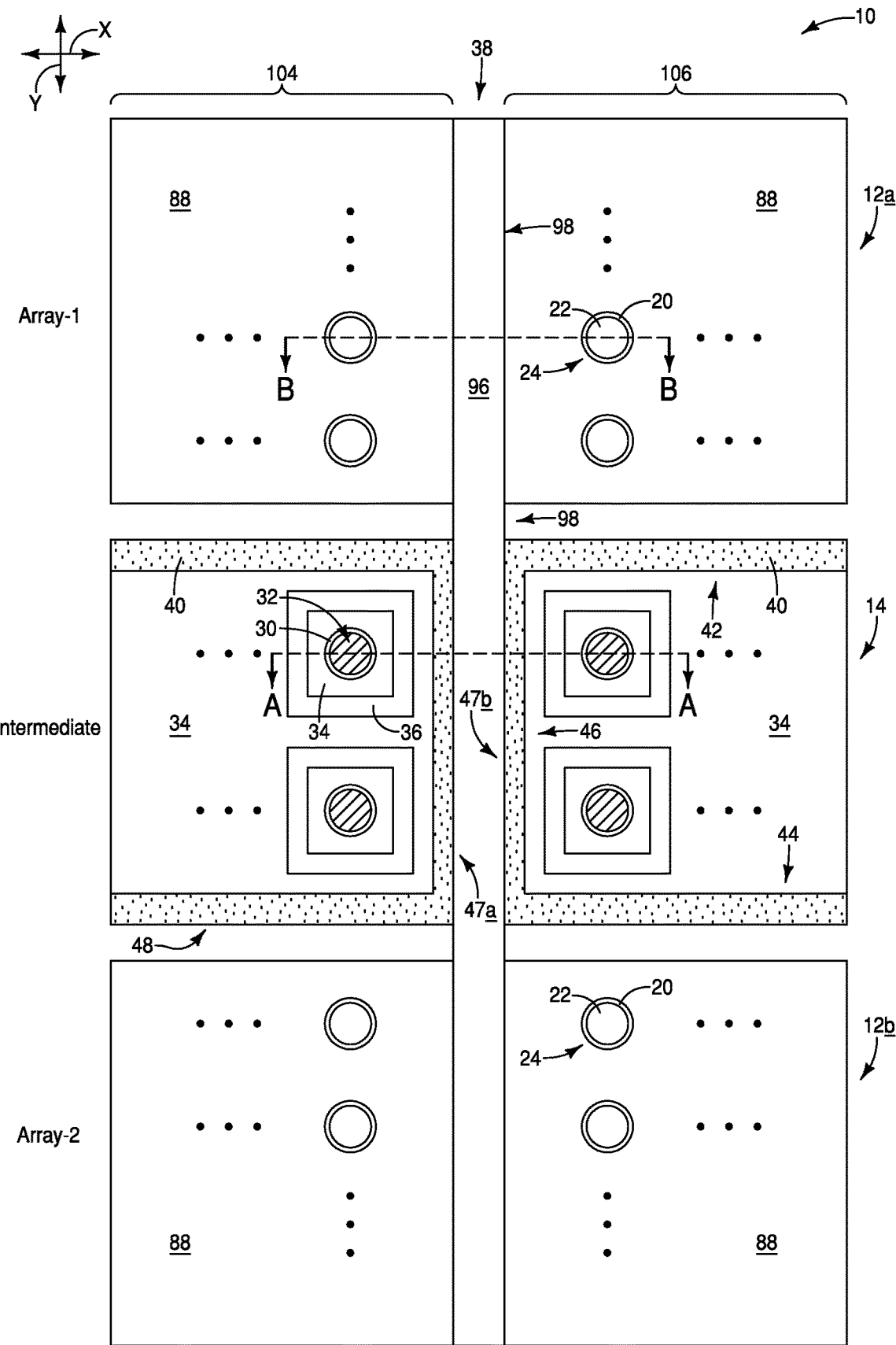
FIG. 12C is a diagrammatic top-down view of the assembly of FIGS. 12A and 12B. The cross-sectional side views of FIGS. 12A and 12B are along the lines A-A and B-B of FIG. 12C, respectively. The top-down view of FIG. 12C is along the lines C-C of FIGS. 12A and 12B.
Figures 1, 12A:
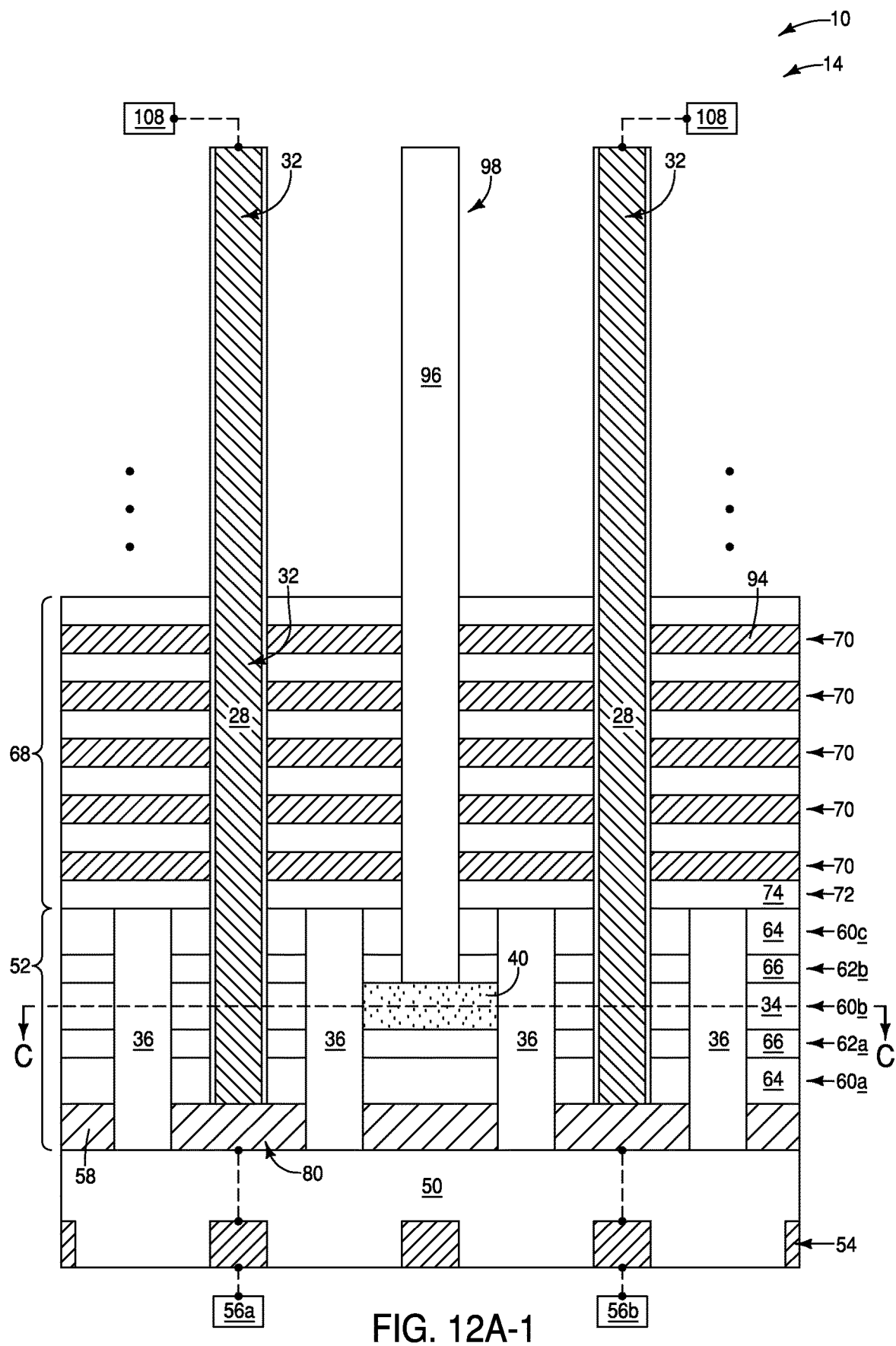
Figures 1, 12C:
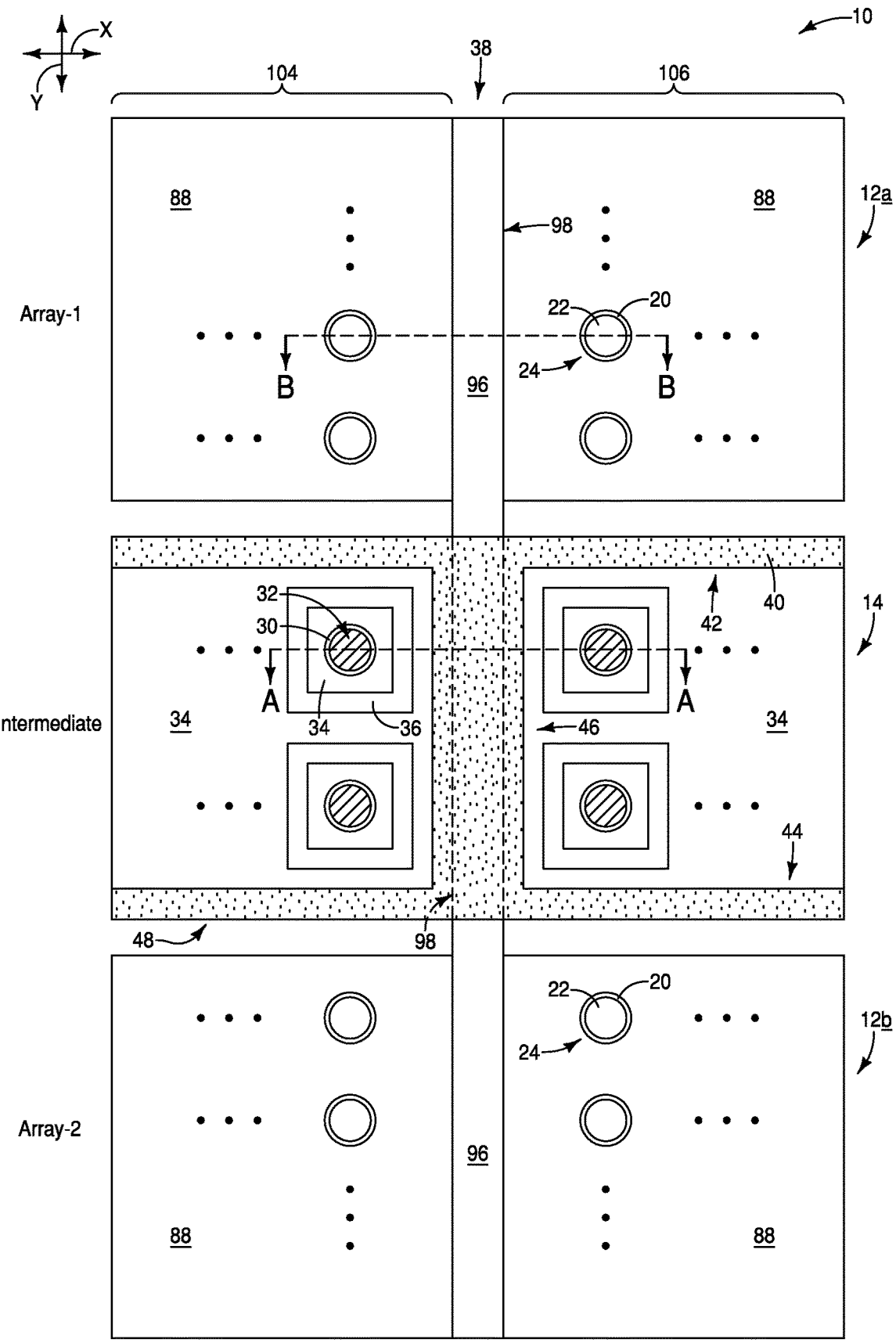

FIG. 12C shows a top-down view along the section C-C of FIGS. 12A and 12B. The panel 98 is within the slit-opening-location 38, and extends across the memory regions 12a and 12b, as well as across the intermediate region 14. The panel 98 is laterally between the first and second memory-block-regions 104 and 106, and subdivides the first memory-block-region 104 from the second memory-block-region 106 (i.e., separates the first memory-block-region from the second memory-block-region).

In some embodiments, the doped-semiconductor-material 40 may be considered to be a first doped-semiconductor-material which is directly adjacent to the panel 98 within the intermediate region 14, and the doped-semiconductor-material 88 may be considered to be a second doped-semiconductor-material which is directly adjacent to the panel 98 within the memory regions 12a and 12b. The second doped-semiconductor-material 88 is directly adjacent to the channel-material-pillars 24, and is electrically coupled to such channel-material-pillars. In contrast, the first doped-semiconductor-material 40 is not directly adjacent to the conductive posts 32, but rather there is at least one insulative material between the doped-semiconductor-material 40 and the conductive posts 32 (e.g., the insulative material 36) so that the conductive posts are not electrically coupled with the doped-semiconductor-material 40.

The doped-semiconductor-material 40 has the substantially H-shaped configuration 48 described above with reference to FIG. 5. However, the panel 96 splits the belt portion 46 into a pair segments 47a and 47b which are on opposing sides of the panel 98. FIG. 12C-1 shows a configuration similar that of FIG. 12C, but based on the assembly of FIG. 12A-1 (i.e., the assembly in which the panel 98 does not penetrate through the doped material 40). The panel 98 of FIG. 12C-1 penetrates through the doped-semiconductor-material 88 of the memory regions 12a and 12b, but does not penetrate through the doped-semiconductor-material 40 of the intermediate region 14. Thus the belt region 46 of the substantially H-shaped structure 48 is under the panel 98 (as is diagrammatically illustrated by showing the panel 98 in dashed-line view relative to the intermediate region 14) and is not split by the panel.

The illustrated panel 98 of FIGS. 12C and 12C-1 may be one of many panels extending across the regions 12a, 12b and 14, and spacing first and second memory-block-regions from one another. Accordingly, the illustrated memory-block-regions 104 and 106 may be representative of a large number of memory-block-regions that may be formed at the process stages represented by FIGS. 12C and 12C-1. The panels may be laterally spaced from one another, and each panel may be along a portion of the doped-semiconductor-material 40. Accordingly, the illustrated belt portion 46 of the H-shaped structure 48 may be one of many belt portions extending across the intermediate region 14. In such embodiments, the belt portions 46, together with the first and second portions 42 and 44 of the H-shaped structures 48, may form a ladder-type configuration, with the belt portions 48 being rungs of the ladder-type configuration, and with the first and second portions 42 and 44 being rails of the ladder-type configuration. In some embodiments, the illustrated H-shaped structure 48 may be considered to be a representative segment of an example ladder-type configuration.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory region and another region adjacent the memory region. Channel-material-pillars are arranged within the memory region, and posts are arranged within said other region. A source structure is coupled to lower regions of the channel-material-pillars. At least some of the posts are conductive posts, and have lower regions coupled with logic circuitry. A panel extends across the memory region and said other region, and separates a first memory-block-region from a second memory-block-region. First doped-semiconductor-material is directly adjacent to the panel within said other region. Second doped-semiconductor-material is directly adjacent to the panel within the memory region. The first doped-semiconductor-material is not electrically coupled with the conductive posts. The second doped-semiconductor-material is electrically coupled with the channel-material-pillars.

Some embodiments include an integrated assembly having a first memory region, a second memory region offset from the first memory region, and an intermediate region between the first and second memory regions. The intermediate region has a first edge proximate the first memory region and has a second edge proximate the second memory region. First channel-material-pillars are arranged within the first memory region. Second channel-material-pillars are arranged within the second memory region. Conductive posts are arranged within the intermediate region. A panel extends across the first memory region, the intermediate region and the second memory region. The panel is laterally between a first memory-block-region and a second memory-block-region. Doped-semiconductor-material is within the intermediate region and is configured as a substantially H-shaped structure having a first leg region along the first edge, a second leg region along the second edge, and a belt region adjacent the panel.

Some embodiments include a method of forming an integrated assembly. A construction is formed to include a first memory region, a second memory region laterally offset from the first memory region, and an intermediate region laterally between the first and second memory regions. The construction includes a first stack extending across the first memory region, the second memory region and the intermediate region. The first stack comprises alternating semiconductor-material-containing regions and intervening regions. There are at least three of the semiconductor-material-containing regions, with one of the semiconductor-material-containing regions being a central semiconductor-material-containing region and being vertically between two others of the semiconductor-material-containing regions. The construction also includes a second stack extending across the first memory region, the second memory region and the intermediate region, with the second stack being over the first stack. The second stack comprises alternating first and second levels, with the first levels comprising sacrificial material and the second levels comprising insulative material. The intermediate region has a first edge proximate the first memory region and has a second edge proximate the second memory region. The central semiconductor-material-containing region has a relatively-doped-portion and a relatively-undoped-portion. The relatively-undoped-portion is within the memory regions and within the intermediate region. The relatively-doped-portion is only within the intermediate region and is configured as a substantially H-shaped structure having a first leg region along the first edge, a second leg region along the second edge, and a belt region extending from the first leg region to the second leg region. Pillars are formed to extend through the second stacks of the first and second memory regions and at least partially into the first stacks of the first and second memory regions. The pillars include cell materials and channel material. Posts are formed to extend through the second stack of the intermediate region and into the second stack of the intermediate region. A slit-opening is formed to pass through the second stack and to the central semiconductor-material-containing region of the first stack. The slit-opening extends across the first memory region, the intermediate region and the second memory region, and is over and along the belt region. The central semiconductor-material-containing region is removed from within the first and second memory regions with one or more etchants flowed into the slit-opening. The relatively-doped-portion of the central semiconductor-material-containing region is resistant to said one or more etchants. The removing of the central semiconductor-material-containing region forms conduits within the first stacks within the first and second memory regions. The conduits are extended through the cell materials and to the channel material of the pillars. Doped-semiconductor-material is formed within the extended conduits. Dopant is out-diffused from the doped-semiconductor-material into the channel material. The out-diffused dopant extends upwardly to at least one of the first levels. At least some of the sacrificial material of the first levels is replaced with conductive material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a construction to include a first memory region, a second memory region laterally offset from the first memory region, and an intermediate region laterally between the first and second memory regions; the construction including a first stack extending across the first memory region, the second memory region and the intermediate region; the first stack comprising alternating semiconductor-material-containing regions and intervening regions; there being at least three of the semiconductor-material-containing regions, with one of the semiconductor-material-containing regions being a central semiconductor-material-containing region and being vertically between two others of the semiconductor-material-containing regions; the construction also including a second stack extending across the first memory region, the second memory region and the intermediate region, with the second stack being over the first stack; the second stack comprising alternating first and second levels, with the first levels comprising sacrificial material and the second levels comprising insulative material; the intermediate region having a first edge proximate the first memory region and a second edge proximate the second memory region; the central semiconductor-material-containing region having a relatively-doped-portion and a relatively-undoped-portion; the relatively-undoped-portion being within the memory regions and within the intermediate region; the relatively-doped-portion being only within the intermediate region and being configured as a substantially H-shaped structure having a first leg region along the first edge, a second leg region along the second edge, and a belt region extending from the first leg region to the second leg region;
    forming pillars extending through the second stacks of the first and second memory regions and at least partially into the first stacks of the first and second memory regions, the pillars including cell materials and channel material;
    forming posts extending through the second stack of the intermediate region and into the first stack of the intermediate region;
    forming a slit-opening to pass through the second stack and to the central semiconductor-material-containing region of the first stack; the slit-opening extending across the first memory region, the intermediate region and the second memory region, and being over and along the belt region;
    removing the central semiconductor-material-containing region from within the first and second memory regions with one or more etchants flowed into the slit-opening, the relatively-doped-portion of the central semiconductor-material-containing region being resistant to said one or more etchants; the removing of the central semiconductor-material-containing region forming conduits in the first stacks within the first and second memory regions;
    extending the conduits through the cell materials and to the channel material of the pillars;
    forming doped-semiconductor-material within the extended conduits;
    out-diffusing dopant from the doped-semiconductor-material into the channel material, the out-diffused dopant extending upwardly to at least one of the first levels; and
    replacing at least some of the sacrificial material of the first levels with conductive material.

2. The method of claim 1 comprising forming a panel within the slit-opening and forming memory cells along the first levels within the first and second memory regions, with the memory cells comprising regions of the channel material; wherein the memory cells are subdivided amongst a first memory-block-region and a second memory-block-region; and wherein the panel is between the first memory-block-region and the second memory-block-region.

3. The method of claim 1 further comprising forming a source-select-device to comprise said at least one of the first levels.

4. The method of claim 1 wherein the central semiconductor-material-containing region comprises silicon, and wherein the relatively-doped-portion of the central semiconductor-material-containing region comprises dopant which includes one or more of carbon, phosphorus, arsenic, boron, nitrogen, oxygen and gallium.

5. The method of claim 4 wherein the dopant is present to a concentration within a range of from about $10^{18}$ atoms/cm$^3$ to about $10^{22}$ atoms/cm$^3$.

6. The method of claim 5 wherein the relatively-undoped-portion of the central semiconductor-material-containing region comprises any dopant therein to a concentration of less than or equal to about $10^{16}$ atoms/cm$^3$.

* * * * *